US009881865B1

(12) United States Patent
Kim et al.

(10) Patent No.: US 9,881,865 B1
(45) Date of Patent: Jan. 30, 2018

(54) SEMICONDUCTOR DEVICES INCLUDING ELECTRICALLY ISOLATED PATTERNS AND METHOD OF FABRICATING THE SAME

(71) Applicants: Samsung Electronics Co., Ltd., Suwon-si, Gyeonggi-do (KR); THE BOARD OF TRUSTEES OF THE LELAND STANFORD JUNIOR UNIVERSITY, Stanford, CA (US)

(72) Inventors: Ki-Hyun Kim, Yongin-si (KR); Friedrich B. Prinz, Stanford, CA (US); Jinsung Kang, Seoul (KR); Youngdong Lee, Suwon-si (KR); John Provine, Stanford, CA (US); Peter Schindler, Stanford, CA (US); Stephen P. Walch, Stanford, CA (US); Yongmin Kim, Stanford, CA (US); Hyo Jin Kim, Stanford, CA (US)

(73) Assignees: Samsung Electronics Co., Ltd. (KR); The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 15/221,338

(22) Filed: Jul. 27, 2016

(51) Int. Cl.
*H01L 23/522* (2006.01)
*H01L 23/532* (2006.01)
(Continued)

(52) U.S. Cl.
CPC .... *H01L 23/5225* (2013.01); *H01L 21/76816* (2013.01); *H01L 21/76832* (2013.01);
(Continued)

(58) Field of Classification Search
CPC ............... H01L 23/5225; H01L 27/108; H01L 2924/1436; H01L 27/10808;
(Continued)

(56) References Cited

U.S. PATENT DOCUMENTS 6,740,977 B2  5/2004 Ahn et al.
9,236,263 B2 * 1/2016 Rouh .................... H01L 21/283
(Continued)

FOREIGN PATENT DOCUMENTS

KR   10-2004-0045578 A   6/2004
KR   10-2004-0050802 A   6/2004
(Continued)

*Primary Examiner* — Marcos D Pizarro
*Assistant Examiner* — Shannon Yi
(74) *Attorney, Agent, or Firm* — Ward and Smith, P.A.

(57) ABSTRACT

A method of forming a composite dielectric material can be provided by performing a first deposition cycle to form a first dielectric material and performing a second deposition cycle to form a second dielectric material on the first dielectric material, wherein the first and second dielectric materials comprise different dielectric materials selected from a list consisting of a transition metal nitride, a transition metal oxide, a transition metal carbide, a transition metal silicide, a post-transition metal nitride, a post-transition metal oxide, a post-transition metal carbide, a post-transition metal silicide, a metalloid nitride, a metalloid oxide, and a metalloid carbide.

15 Claims, 42 Drawing Sheets

(51) Int. Cl.
*H01L 23/528* (2006.01)
*H01L 23/535* (2006.01)
*H01L 27/108* (2006.01)
*H01L 21/768* (2006.01)

(52) U.S. Cl.
CPC .... *H01L 21/76877* (2013.01); *H01L 23/5226* (2013.01); *H01L 23/5283* (2013.01); *H01L 23/535* (2013.01); *H01L 23/53257* (2013.01); *H01L 23/53295* (2013.01); *H01L 27/10823* (2013.01); *H01L 27/10876* (2013.01); *H01L 27/10885* (2013.01)

(58) Field of Classification Search
CPC ......... H01L 27/10811; H01L 27/10814; H01L 27/10817; H01L 27/10823
See application file for complete search history.

(56) References Cited

U.S. PATENT DOCUMENTS

| | | | |
|---|---|---|---|
| 2005/0170599 A1* | 8/2005 | Joo | H01L 28/91 438/396 |
| 2008/0318443 A1 | 12/2008 | Kim et al. | |
| 2011/0233631 A1* | 9/2011 | Son | H01L 27/105 257/298 |
| 2012/0086063 A1* | 4/2012 | Taniguchi | H01L 27/10814 257/300 |
| 2013/0256828 A1* | 10/2013 | Lee | H01L 27/04 257/506 |
| 2014/0273530 A1 | 9/2014 | Nguyen et al. | |
| 2015/0001588 A1 | 1/2015 | Gunji et al. | |
| 2015/0050806 A1 | 2/2015 | Park et al. | |
| 2015/0114827 A1 | 4/2015 | Cao et al. | |
| 2015/0179651 A1* | 6/2015 | Park | H01L 27/10885 257/296 |
| 2016/0099304 A1* | 4/2016 | Mathur | H01L 28/75 257/532 |
| 2016/0181143 A1* | 6/2016 | Kwon | H01L 27/1052 438/586 |
| 2017/0069726 A1* | 3/2017 | Kye | H01L 29/401 |

FOREIGN PATENT DOCUMENTS

KR 10-2004-0104096 A 12/2004
KR 2014-0102345 A 8/2014

* cited by examiner

SEMICONDUCTOR DEVICES INCLUDING ELECTRICALLY ISOLATED PATTERNS AND METHOD OF FABRICATING THE SAME

FIELD

The present disclosure relates to a semiconductor device and a method of fabricating the same.

BACKGROUND

As the electronic industry advances, there is an increasing demand for a semiconductor device with a higher integration density and higher performance. To meet such a demand, it is may be possible to reduce a process margin (for example, in a photolithography process). Although a variety of studies are being conducted to solve the difficulties, the reduction of the process margin may lead to several difficulties in fabricating a semiconductor device.

SUMMARY

In some embodiments, a method of forming a composite dielectric material can be provided by performing a first deposition cycle to form a first dielectric material and performing a second deposition cycle to form a second dielectric material on the first dielectric material, wherein the first and second dielectric materials comprise different dielectric materials selected from a list consisting of a transition metal nitride, a transition metal oxide, a transition metal carbide, a transition metal silicide, a post-transition metal nitride, a post-transition metal oxide, a post-transition metal carbide, a post-transition metal silicide, a metalloid nitride, a metalloid oxide, and a metalloid carbide.

In some embodiments, a semiconductor device can include line patterns provided on a substrate, where the line patterns extend in a first direction and parallel to each other. Conductive patterns can be provided spaced apart from each other in the first direction, between respective pairs of the line patterns and respective insulating fences can include a metal nitride layer, between each of the conductive patterns.

In some embodiments, a semiconductor device can include a substrate with an active region and a device isolation layer provided on the substrate to define the active region. Gate stacks can cross the active region and the device isolation layer in a first direction and first and second impurity regions can be formed in the active region and adjacent opposing sides of each of the gate stacks. Bit line structures can be electrically connected to the second impurity regions, where the bit line structures extend in a second direction crossing the first direction. Respective contact plugs can be on the first impurity region between the bit line structures and respective insulating fences can be on the gate stacks between the bit line structures, where the respective insulating fences and the contact plugs can be alternately disposed in the second direction and each of the respective insulating fences can include a metal nitride layer.

In some embodiments, a method of fabricating a semiconductor device can include forming line patterns on a substrate to extend in a first direction parallel to each other. Sacrificial patterns can be formed between the line patterns, where the sacrificial patterns can be apart from each other in the first direction. Insulating fences can be formed to include a metal nitride layer, in gap regions defined by the sacrificial patterns and the line patterns. The sacrificial patterns can be removed and conductive patterns can be formed between the insulating fences.

In some embodiments, a method of fabricating a semiconductor device can include forming gate stacks to cross an active region of a substrate and a device isolation layer in a first direction. First and second impurity regions can be formed in the active region on opposing sides of each of the gate stacks and bit line structures can be formed to electrically connect to the second impurity regions, where the bit line structures extend in a second direction crossing the first direction. A metal nitride layer can be formed on the gate stacks between the bit line structures to form insulating fences spaced apart from each other in the second direction and contact plugs can be formed on the first impurity regions and between the insulating fences.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A to 7A are plan views illustrating a method of fabricating the semiconductor device 10 of FIG. 1A.

FIGS. 4B to 7B are sectional views taken along line I-P of FIGS. 4A to 7A, respectively.

FIGS. 10A to 20A are plan views illustrating a method of fabricating the semiconductor device of FIG. 9A.

FIGS. 10B to 20B are sectional views taken along line II-II' of FIGS. 10A to 17A, respectively.

FIGS. 10C to 20C are sectional views taken along line III-III' of FIGS. 10A to 17A, respectively.

Figure 1A:
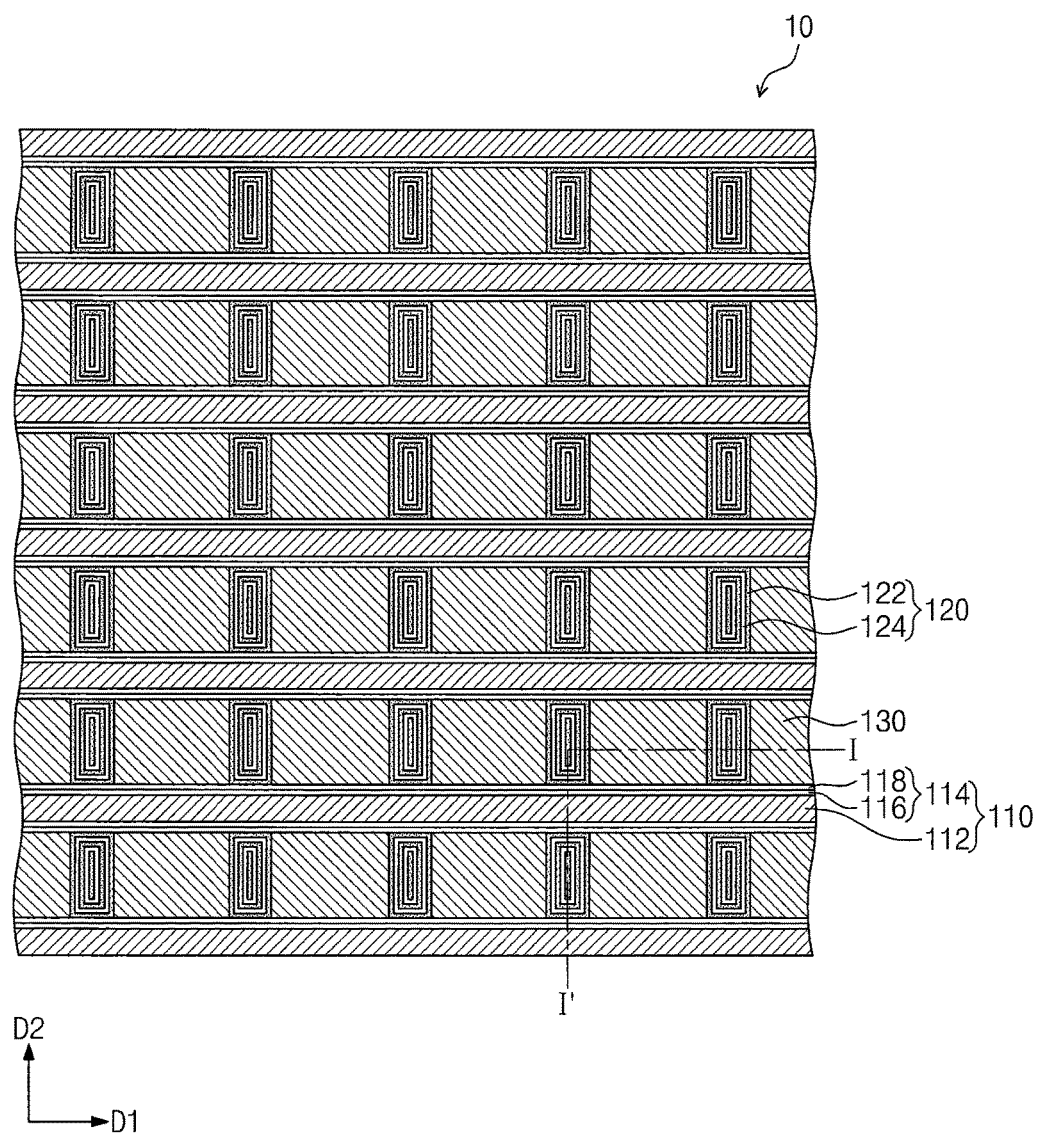
FIG. 1A is a plan view illustrating a semiconductor device according to exemplary embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the embodiments in the detailed description are described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shapes illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

As appreciated by the present inventive entity, a silicon nitride film deposited at low or moderate temperatures can suffer from a higher than desirable wet etch rate. Silicon nitride films of low wet etch rate an low leakage current can be attained when deposited at temperatures close to 800° C.; however, deposition under such high temperature conditions can be incompatible with various nanofabrication processes.

As described herein, in some embodiments, thin films can be provided to be simultaneously low in wet etch rate in hydrofluoric acid and low in leakage current. In some embodiments, a mixture of silicon nitride as a first dielectric material and a different, second dielectric material deposited by plasma enhanced atomic layer deposition (PEALD) can provide a mixed or composite film having such a combination of characteristics. In some embodiments, the second dielectric material is aluminum nitride, and, in other embodiments, the second dielectric material is hafnium nitride, silicon carbide, or titanium nitride. The first dielectric material and the second dielectric material can be different dielectric materials selected from transition metal nitrides, transition metal oxides, transition metal carbides, transition metal silicides, post-transition metal nitrides, post-transition metal oxides, post-transition metal carbides, post-transition metal silicides, metalloid nitrides, metalloid oxides, and metalloid carbides.

In some embodiments, plasma enhanced atomic layer deposition (PEALD) can be used to deposit thin films with high uniformity and conformality at a thickness of a few nanometers or more. For example, silicon nitride films and aluminum nitride films each can be formed by PEALD, as well as mixtures or laminates of those films with controllable compositional ratios of aluminum:silicon. The inclusion of aluminum nitride in an overall composite film with silicon nitride can provide a reduced wet etch rate in dilute hydrofluoric acid while simultaneously providing a low leakage current. Similar benefits can be attained by including another dielectric material in place of, or in combination with, aluminum nitride, such as hafnium nitride or silicon carbide. In some embodiments, depositions of composite films can be performed at low or moderate temperatures, such as about 500° C. or less, about 450° C. or less, about 400° C. or less, about 350° C. or less, about 300° C. or less, or about 250° C. or less, thereby providing compatibility with CMOS and other nanofabrication processes.

In some embodiments, a method of forming a composite film on a substrate includes sequentially performing a first atomic layer deposition cycle to form at least a partial layer of a first dielectric material on the substrate, followed by performing a second atomic layer deposition cycle to form at least a partial layer of a second dielectric material on previously formed layers on the substrate. The first deposition cycle and the second deposition cycle can be repeated sequentially to form a composite film having a desired overall thickness. It is noted that the first deposition cycle can be repeated multiple times before the second deposition cycle, and that the second deposition cycle can be repeated multiple times before the first deposition cycle. It is also noted that either deposition cycle can be performed first. In other words, an initially formed layer can be either a layer of the first dielectric material or a layer of the second dielectric material.

Depositions of composite films can be performed at low or moderate temperatures, such as about 500° C. or less, about 450° C. or less, about 400° C. or less, about 350° C. or less, about 300° C. or less, or about 250° C. or less, thereby providing compatibility with CMOS and other nanofabrication processes.

In some embodiments, performing a first deposition cycle includes sequentially exposing a substrate, or a portion of the substrate, to deposition gases of chemical precursors or reactants including a first precursor and a second precursor. In the case of silicon nitride as a first dielectric material, the first precursor is a silicon-containing precursor, and the second precursor is a nitrogen containing precursor. In the case of PEALD, either, or both, of the first precursor and the second precursor can be in the form of a plasma. Examples of suitable silicon-containing precursors include tris(dimethylamino)silane, dichlorosilane, trisilylamine, bis(tertbutylamino) silane, other silicon-containing inorganic compounds, and other silicon-containing organic compounds, and examples of suitable nitrogen-containing precursors include $N_2$ plasma, $NH_3$ plasma and a combination of $N_2$ and $H_2$ plasma. The first precursor and the second precursor react and form at least a partial layer of the first dielectric material on the substrate during the first deposition cycle.

Figure 2:
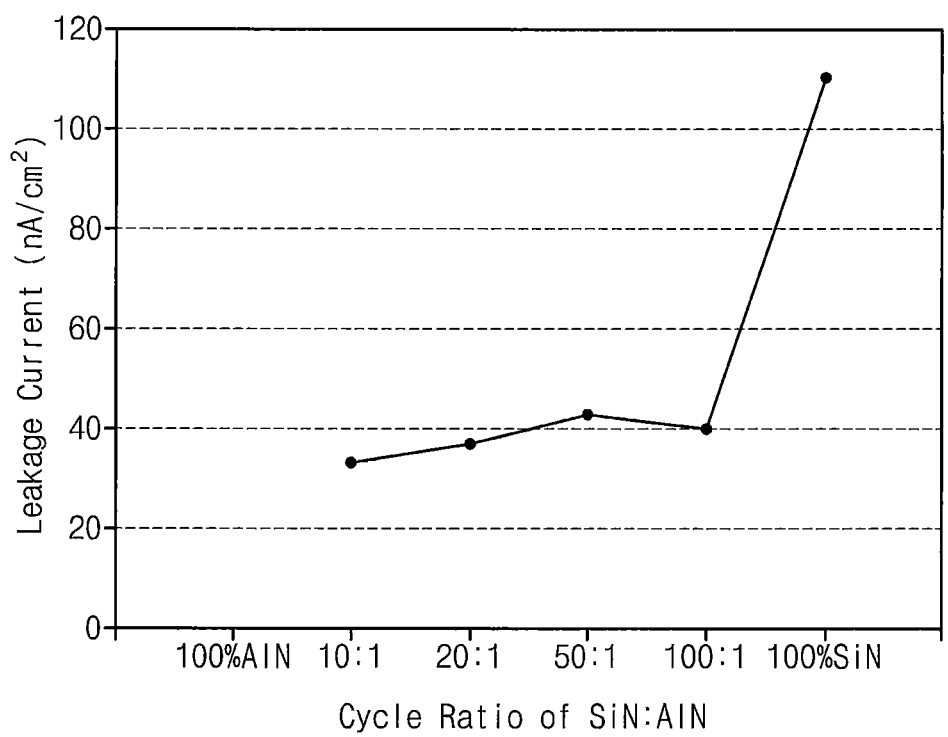
FIG. 2 is a graph showing a leakage current between conductive patterns according to a component ratio between a second silicon nitride layer and a second metal nitride layer of FIG. 1A.
Figure 8:
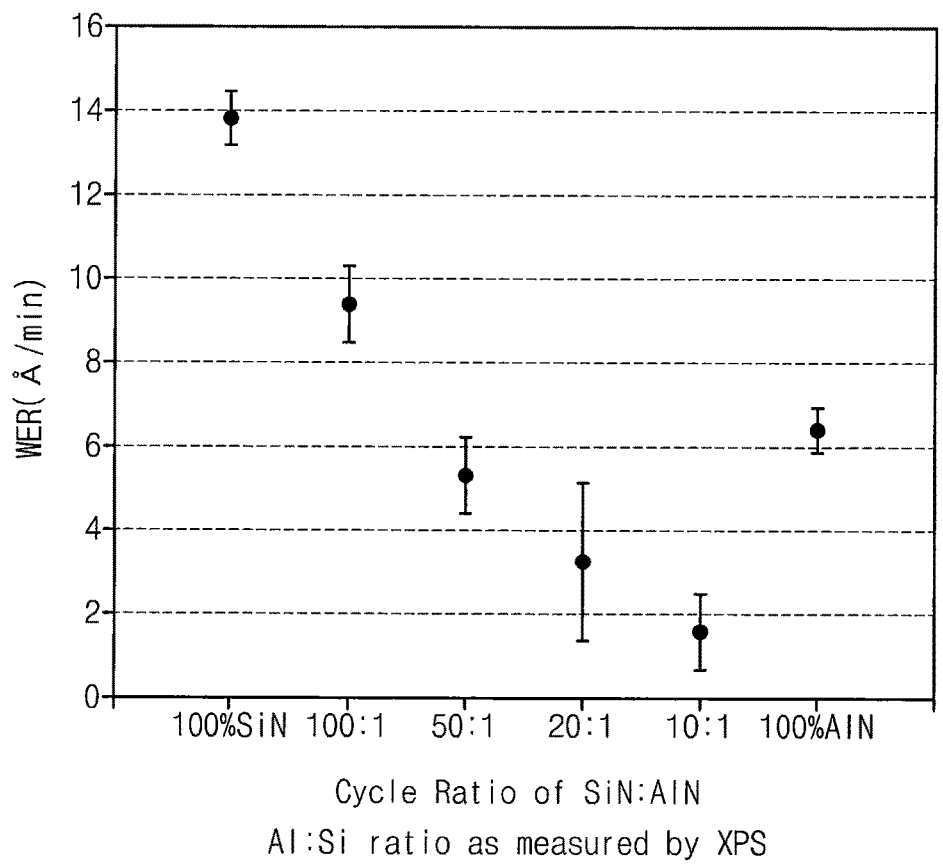
FIG. 8 is a XPS data showing a change in an etch-resistant property according to a component ratio of the insulating fence.

In some embodiments, performing a second deposition cycle includes sequentially exposing a substrate, along with previously formed layers on the substrate, to deposition gases of chemical precursors or reactants including a third precursor and a fourth precursor. In the case of aluminum nitride as a second dielectric material, the third precursor is an aluminum-containing precursor, and the fourth precursor is a nitrogen-containing precursor. In the case of hafnium nitride as the second dielectric material, the third precursor is a hafnium-containing precursor, and the fourth precursor is a nitrogen-containing precursor. In the case of silicon carbide as the second dielectric material, the third precursor is a silicon-containing precursor, and the fourth precursor is a carbon-containing precursor. In the case of titanium nitride as the second dielectric material, the third precursor is a titanium containing precursor, and the fourth precursor is a nitrogen-containing precursor. In the case of PEALD, either, or both, of the third precursor and the fourth precursor can be in the form of a plasma. Examples of suitable aluminum-containing precursors include trimethylaluminum and other organoaluminum compounds, and examples of suitable nitrogen-containing precursors include $N_2$ plasma, $NH_3$ plasma and a combination of $N_2$ and $H_2$ plasma. The third precursor and the fourth precursor react and form at least a partial layer of the second dielectric material on previously formed layers on the substrate during the second deposition cycle. Resulting composite films of some embodiments can simultaneously exhibit low wet etch rate in hydrofluoric acid and low leakage current. For example, etch rate in aqueous hydrofluoric acid with water to hydrofluoric acid ratio of about 100:1 can be, as shown in FIG. 8, a leakage current at an applied electric field of about 2 MV/cm can be as shown in FIG. 2.

In some embodiments, forming a composite film on a substrate includes repeating a first deposition cycle and a second deposition cycle for a total number of deposition cycles of about 50 or more, about 100 or more, about 200 or more, about 300 or more, about 400 or more, about 500 or more, about 1,000 or more, or about 2,000 or more, and with a cycle ratio of the first deposition cycle and the second deposition cycle of up to about 999:1, up to about 99:1, up to about 49:1, up to about 19:1, or up to about 9:1, and down to about 5:1 or less, down to about 4:1 or less, down to about 3:1 or less, down to about 2:1 or less, down to about 1:1 or less, or down to about 1:2 or less. A compositional ratio (e.g., in terms of an atomic concentration ratio) of aluminum (or another transition metal, post-transition metal, metalloid, or other atomic species included in a second dielectric material) and silicon can be at least about 0.001, at least about 0.01, at least about 0.1, at least about 0.2, at least about 0.3, at least about 0.4, at least about 0.5, or at least about 0.6, and up to about 0.8 or more, up to about 0.9 or more, up to about 1 or more, up to about 1.1 or more, or up to about 1.5 or more In some embodiments, each layer of a first dielectric material or a second dielectric material can have a thickness in a range from less than a full monolayer thick (e.g., about 1 Å) to a few nanometers, such as about 2 nanometers or more, about 2.5 nanometers or more, or about 3 nanometers or more. An overall thickness of a composite film of the first dielectric material and the second dielectric material can be in a range of about 1 nanometer to about 100 nanometers or more, such as from about 1 nanometer to about 50 nanometers, from about 1 nanometer to about 40 nanometers, from about 1 nanometer to about 30 nanometers, from about 1 nanometer to about 20 nanometers, or from about 1 nanometer to about 10 nanometers, and a thickness ratio of layers of the first dielectric material included in the composite film and layers of the second dielectric material included in the composite film can be up to about 999:1, up to about 99:1, up to about 49:1, up to about 19:1, or up to about 9:1, and down to about 5:1 or less, down to about 4:1 or less, down to about 3:1 or less, down to about 2:1 or less, down to about 1:1 or less, or down to about 1:2 or less.

Figure 1B:
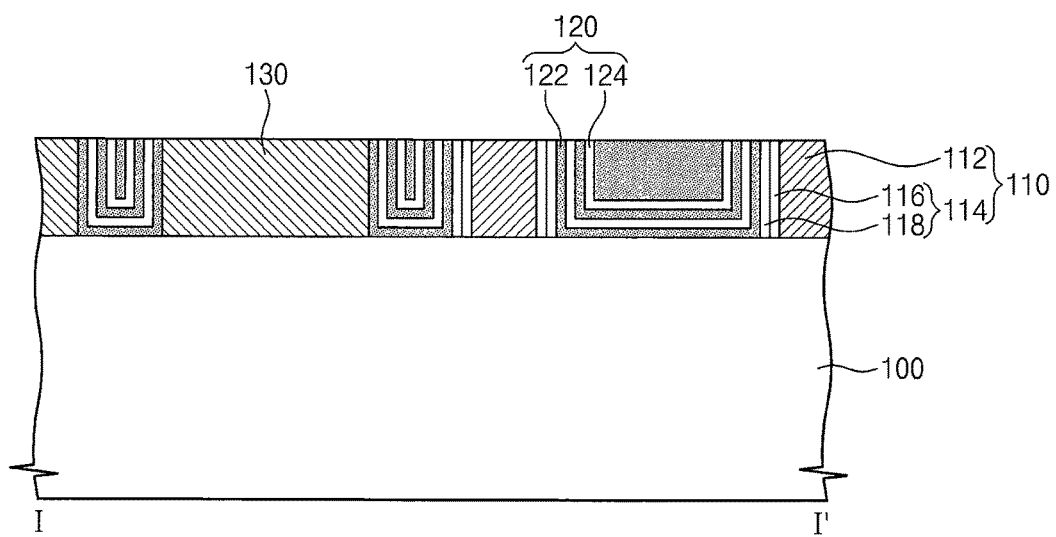
FIG. 1B is a sectional view taken along line I-P of FIG. 1A.

FIG. 1A is a plan view illustrating a semiconductor device according to exemplary embodiments of the inventive concept. FIG. 1B is a sectional view taken along line I-I' of FIG. 1A.

Referring to FIGS. 1A and 1B, a semiconductor device 10 according to exemplary embodiments of the inventive concept may include a substrate 100, line patterns 110, insulating fences 120, and conductive patterns 130.

The line patterns 110 may extend in a first direction D1 and may be separated from each other in a second direction D2 perpendicular to the first direction D1. In exemplary embodiments, each of the line patterns 110 may include a conductive line 112 and a spacer 114.

The conductive lines 112 may include at least one of metals or metal compounds. For example, the conductive lines 112 may include at least one of tungsten (W), copper (Cu), aluminum (Al), titanium (Ti), tantalum (Ta), titanium nitride (TiN), tantalum nitride (TaN), tungsten nitride (WN), or metal silicides. Alternatively, the conductive lines 112 may include a doped poly silicon layer.

The spacers 114 may be disposed on side surfaces of each of the conductive lines 112. In exemplary embodiments, the spacer 114 may include a nitride layer. For example, the spacer 114 may include a first silicon nitride layer 116 and a first metal nitride layer 118.

The first silicon nitride layer 116 may be disposed on opposing sidewalls of each of the conductive lines 112. The first metal nitride layer 118 may be disposed on the first silicon nitride layer 116. In exemplary embodiments, each of the first metal nitride layer 118 may include aluminum nitride (AlN), hafnium nitride (HfN), or yttrium nitride (YiN). Alternatively, each of the first metal nitride layer 118 may include aluminum oxynitride (AlON), titanium nitride (TiN), tantalum nitride (TaN), or tungsten nitride (WN).

The line pattern 110 may further include a capping pattern disposed on the conductive line 112.

Each of the insulating fences 120 may be disposed between a corresponding adjacent pair of the line patterns 110. The insulating fences 120 may have top surfaces that are substantially coplanar with those of the line patterns 110. The insulating fences 120 may extend in the second direction D2. The insulating fences 120 may be disposed spaced apart from each other in the first direction D1. In exemplary embodiments, the insulating fences 120 may include at least one of nitride layers. For example, each of the insulating fences 120 may include at least one second silicon nitride layer 122 and at least one second metal nitride layer 124. The second silicon nitride layer 122 and the second metal nitride layer 124 may be stacked in an alternate manner. The second metal nitride layer 124 may include, for example, aluminum nitride (AlN). Alternatively, the second metal nitride layer 124 may include hafnium nitride (HfN) or yttrium nitride (YiN). In exemplary embodiments, the second silicon nitride layer 122 and the second metal nitride layer 124 may be provided to have a component ratio and/or thickness ratio of about 100:1 or less. For example, the second silicon nitride layer 122 and the second metal nitride layer 124 may be provided to have a component ratio of about 10:1.

Between each pair of the line patterns 110, the conductive patterns 130 and the insulating fences 120 may be alternately disposed in the first direction D1. Each of the conductive patterns 130 may be electrically separated from the line patterns 110 by the spacers 114. Also, adjacent ones of the conductive patterns 130 may be electrically separated from each other by the insulating fences 120. The conductive patterns 130 may have top surfaces that are substantially coplanar with those of the line patterns 110 and the insulating fences 120. In exemplary embodiments, the conductive patterns 130 may include at least one of metals or metal compounds. For example, the conductive patterns 130 may include at least one of tungsten (W), copper (Cu), aluminum (Al), titanium (Ti), tantalum (Ta), titanium nitride (TiN), tantalum nitride (TaN), tungsten nitride (WN), or metal silicides. Alternatively, the conductive patterns 130 may include a doped poly silicon layer.

FIG. 2 is a graph showing a leakage current between the conductive patterns 130 according to a component ratio between the second silicon nitride layer 122 and the second aluminum nitride layer 124 of FIG. 1A. It will be understood, however, that FIG. 2 illustrates the relationship between the second silicon nitride layer 122 and the second metal nitride layer, not only aluminum nitride Referring to FIGS. 1A, 1B, and 2, when the second silicon nitride layer 122 and the second aluminum nitride layer 124 were provided to have a component ratio and/or thickness ratio of about 10:1, a leakage current was minimized.

In other words, when the second silicon nitride layer 122 and the second metal nitride layer 124 were provided to have a component ratio of about 100:1, the leakage current was about 40 nA/cm$^2$ or less. When the insulating fences 120 consisted of only the second silicon nitride layer 122, the leakage current was about 110 nA/cm$^2$. This means that the higher the component ratio of the second silicon nitride layer 122 provided in the insulating fence 120, the larger the leakage current. In other words, this means that the higher the thickness ratio of the second silicon nitride layer 122 provided in the insulating fence 120, the larger the leakage current. Here, strength of an electric field applied to the insulating fences 120 was about 2 MV/cm.

An amount of a leakage current may be inversely proportional to a dielectric constant of each of the second silicon nitride layer 122 and the second metal nitride layer 124. The second silicon nitride layer 122 may have a dielectric constant higher than that of a silicon oxide layer. For example, the silicon oxide layer may have a dielectric constant of about 3.9, and the second silicon nitride layer 122 may have a dielectric constant of about 7.5. The second metal nitride layer 124 may have a dielectric constant higher than that of the second silicon nitride layer 122. The second metal nitride layer 124 may be formed of aluminum nitride, and in this case, the second metal nitride layer 124 may have a dielectric constant of about 8.4. An increase in component ratio of the second metal nitride layer 124 with respect to the second silicon nitride layer 122 may lead to a reduction of the leakage current.

By contrast, an increase in component ratio of the second metal nitride layer 124 with respect to the second silicon nitride layer 122 may lead to an increase in coupling signal interference between the conductive patterns 130. That is, by decreasing the component ratio of the second metal nitride layer 124 with respect to the second silicon nitride layer 122, it is possible to suppress the coupling signal interference from occurring between the conductive patterns 130.

In the case where the second silicon nitride layer 122 and the second metal nitride layer 124 are provided to have the component ratio of about 10:1, it is possible to reduce or minimize the leakage current and the coupling signal inference between the conductive patterns 130. However, the inventive concept may not be limited thereto. In exemplary embodiments, the second silicon nitride layer 122 and the second metal nitride layer 124 may be provided to have a component ratio ranging from about 10:1 to about 1:1. Accordingly, as shown in FIG. 2, Al doped SiN (when provided in the relative concentrations shown) can provide current leakage and coupling improvement relative to the use of pure AlN or pure SiN.

Figure 3:
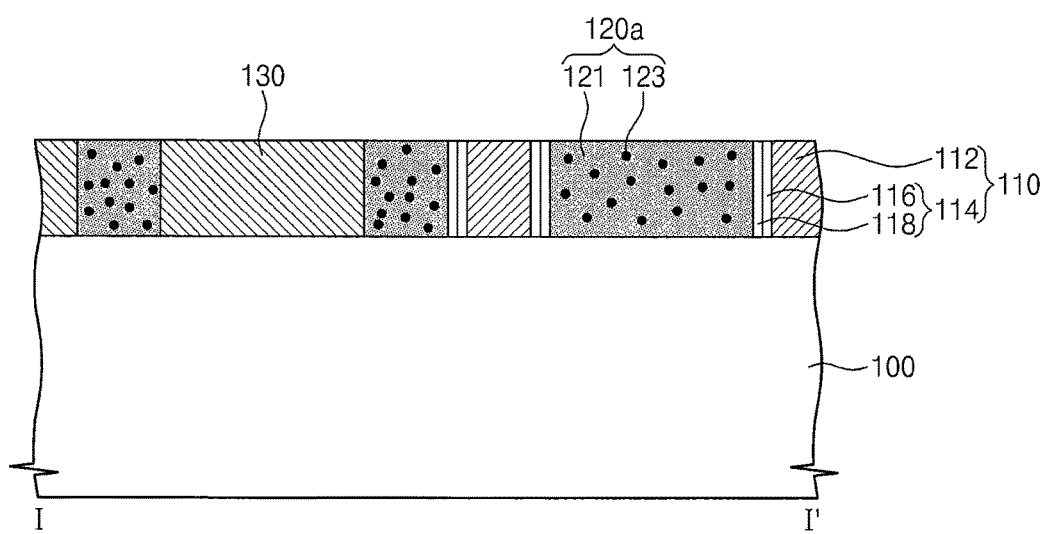
FIG. 3 is a sectional view illustrating an example of insulating fences of FIG. 1A.

FIG. 3 is a sectional view illustrating an example of the insulating fences 120a of FIG. 1A.

Referring to FIGS. 1A, 1B, 2, and 3, the insulating fences 120a may include at least one metal nitride material. The substrate 100, the line patterns 110, and the conductive patterns 130 may be configured to have substantially the same features as those of FIG. 1B.

In exemplary embodiments, the insulating fences 120a may include a silicon nitride layer 121 doped with metallic impurities 123. The presence of the metallic impurities 123 may make it possible to allow the silicon nitride layer 121 to have an increased permittivity and/or dielectric constant. An increase in work-function of the metallic impurities 123 may lead to an increase in dielectric constant of the silicon nitride layer 121. An electric coupling effect between the conductive patterns 130 may be proportional to the dielectric constant of the silicon nitride layer 121. In other words, in the case where the metallic impurities 123 have low work-function, the electric coupling effect can be suppressed.

In exemplary embodiments, the metallic impurities 123 may have a work-function lower than that of the conductive patterns 130. For example, the conductive patterns 130 may be formed of tungsten (W), whose work-function ranges from about 4.32 to about 5.22. The metallic impurities 123 may include at least one of aluminum, hafnium, or yttrium. Here, work-functions of aluminum (Al), hafnium (Hf), and yttrium (Y) are 4.06 eV, 3.9 eV, and 3.1 eV, respectively.

If a content of the metallic impurities 123 in the silicon nitride layer 121 is increased, an amount of the leakage current flowing through the silicon nitride layer 121 may be increased. This may be because the metallic impurities 123 serve as a path of such a leakage current.

The metallic impurities 123 may be reacted with nitrogen atoms present in the silicon nitride layer 121 to form a metal nitride material. The metal nitride material may include aluminum nitride, hafnium nitride, or yttrium nitride. In exemplary embodiments, the metal nitride material may have a dielectric constant higher than that of the silicon nitride layer 121. For example, in the case where the silicon nitride layer 121 and the metal nitride are provided to have a component ratio of about 10:1, the leakage current and the coupling signal interference between the conductive patterns 130 may be minimized.

A method of fabricating the semiconductor device 10 will be described below.

FIGS. 4A to 7A are plan views illustrating a method of fabricating the semiconductor device 10 of FIG. 1A. FIGS. 4B to 7B are sectional views taken along line I-I' of FIGS. 4A to 7A, respectively.

Figure 4A:
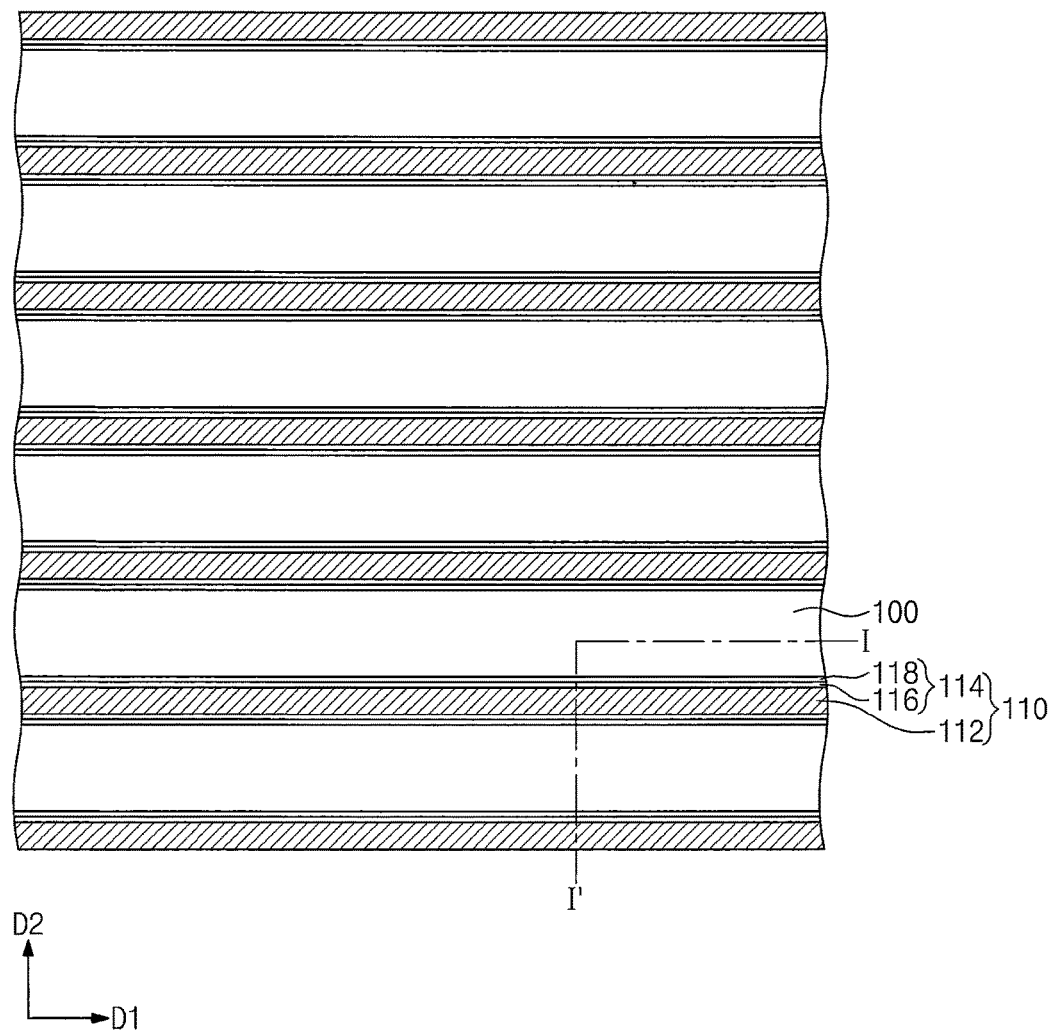
Figure 4B:
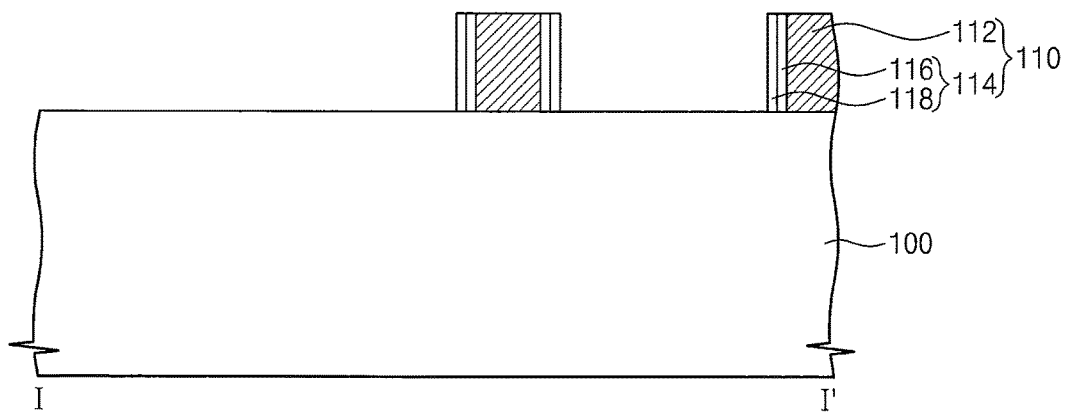

Referring to FIGS. 4A and 4B, the line patterns 110 may be formed on the substrate 100 to extend in the first direction D1.

The line patterns 110 may be formed to be spaced apart from each other in the second direction D2. In exemplary embodiments, each of the line patterns 110 may include the conductive line 112 and the spacer 114. The conductive lines 112 of the line patterns 110 may include at least one of doped polysilicon, metals, or metal compounds.

The spacers 114 may be formed on both sidewalls of the conductive line 112. For example, the first silicon nitride layer 116 may be formed on both sidewalls of the conductive line 112 by a plasma-enhanced atomic layer deposition (PEALD) method. The first metal nitride layer 118 may be formed by the same method as that for the first silicon nitride layer 116. The first metal nitride layer 118 may be formed on the first silicon nitride layer 116 by a PEALD method. A plurality of the first silicon nitride layers 116 and a plurality of the first metal nitride layers 118 may be formed in an alternate manner. In exemplary embodiments, the spacer 114 may be formed of a silicon nitride layer which is doped with metallic impurities by a PEALD method. The metallic impurities may be reacted with nitrogen atoms in silicon nitride, thereby forming a metal nitride material.

Thereafter, the first silicon nitride layer 116 and the first metal nitride layer 118 may be etched in a self-aligned and anisotropic manner. As a result, the first silicon nitride layer 116 and the first metal nitride layer 118 may be formed on both sidewalls of the conductive line 112.

Figure 5A:
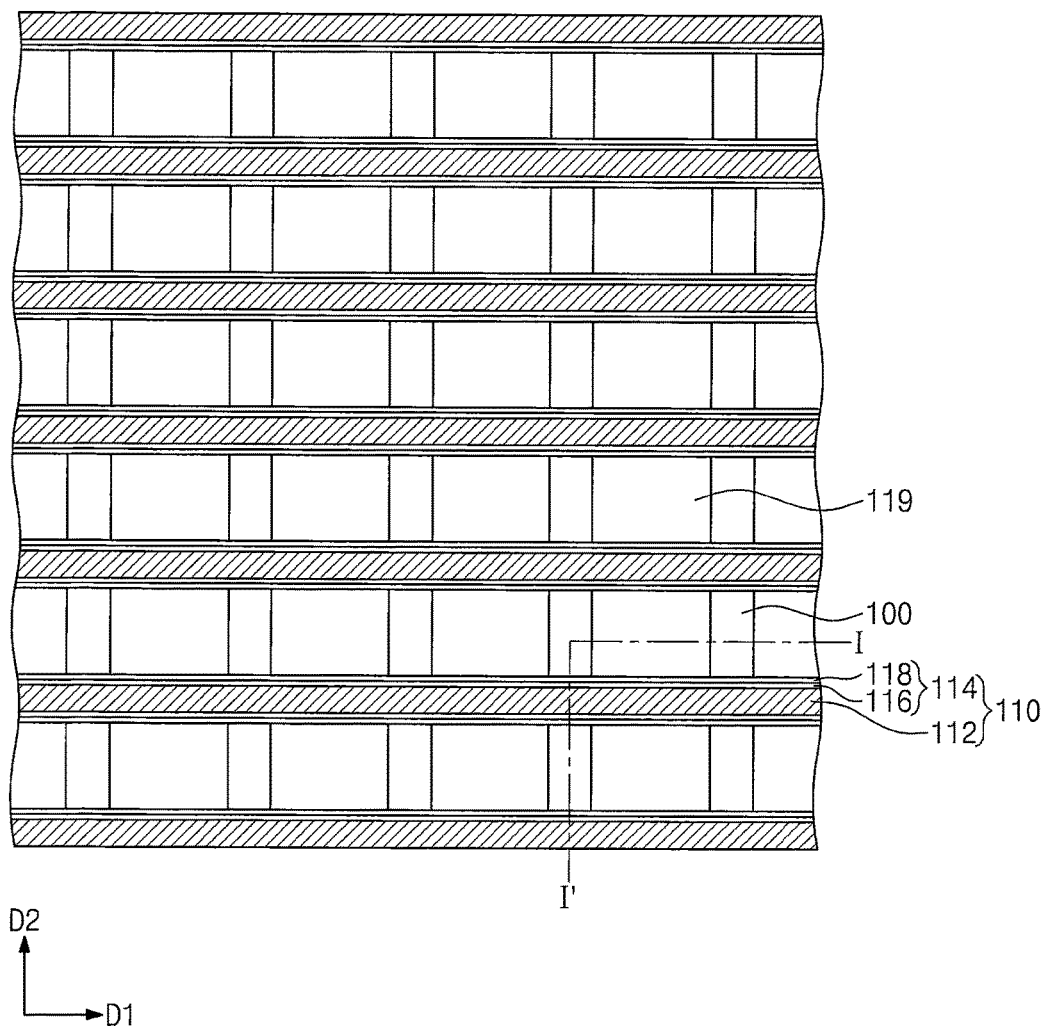
Figure 5B:
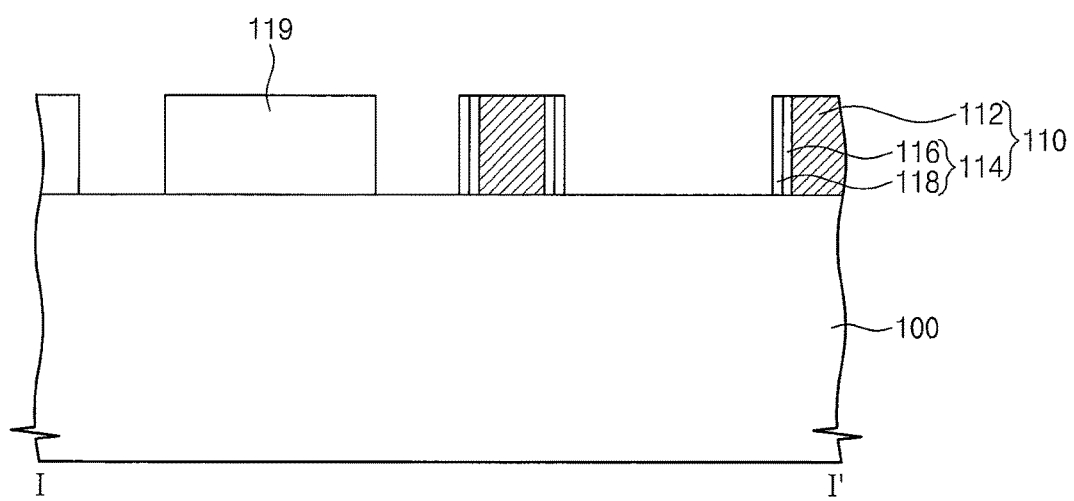

Referring to FIGS. 5A and 5B, sacrificial patterns 119 may be formed on the substrate 100 and between the line patterns 110. The sacrificial patterns 119 may be spaced apart from each other in the first direction D1 and in the second direction D2.

In exemplary embodiments, the sacrificial patterns 119 may include at least one of materials having a high etch selectivity with respect to the line patterns 110. For example, the sacrificial patterns 119 may include at least one of oxides (e.g., silicon oxide) formed by a plasma-enhanced chemical vapor deposition (PECVD) method or a spin coating method.

Figure 6A:
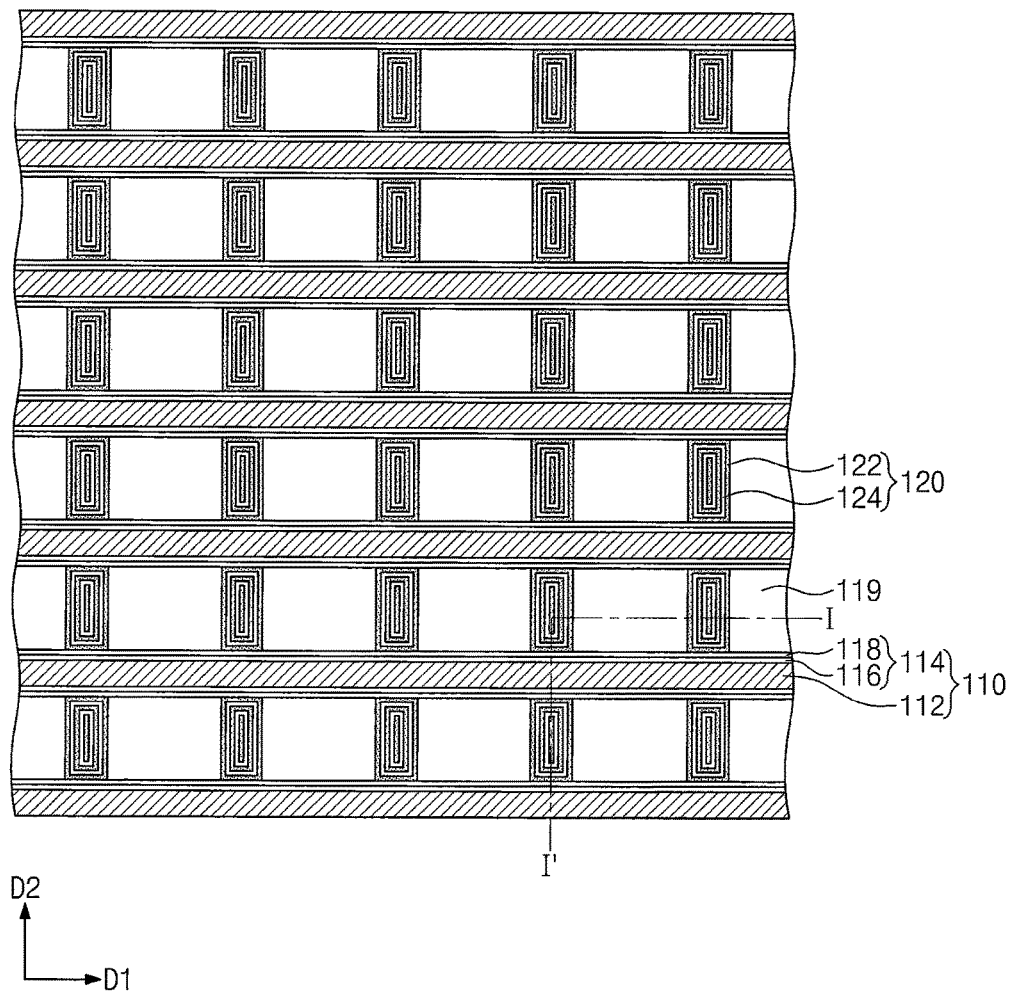
Figure 6B:
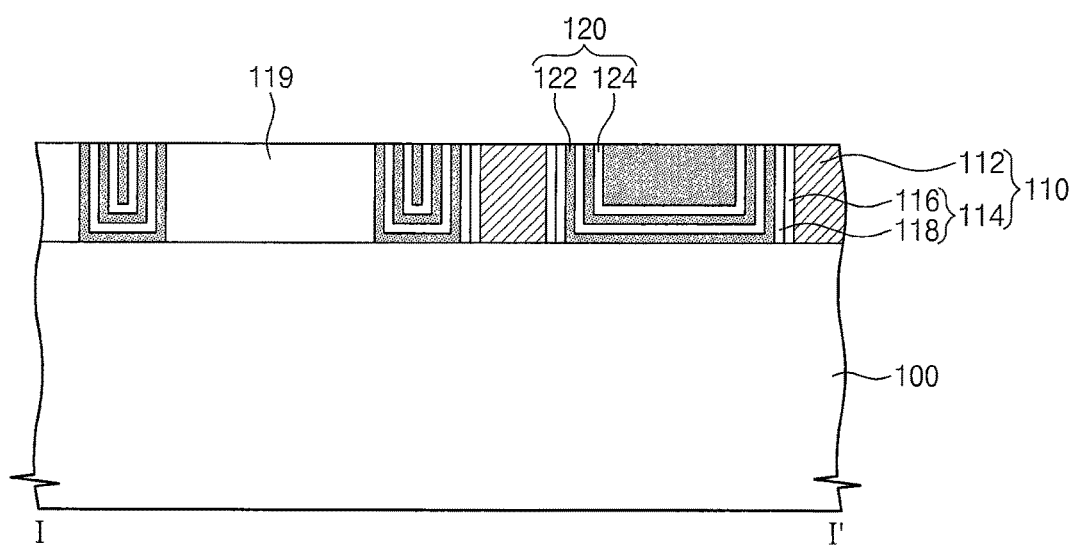

Referring to FIGS. 6A and 6B, the insulating fences 120 may be formed between the line patterns 110 to fill gap regions between the sacrificial patterns 119.

The insulating fences 120 and the sacrificial patterns 119 may be alternately arranged in the first direction D1. In exemplary embodiments, each of the insulating fences 120 may include the second silicon nitride layer 122 and the second metal nitride layer 124, which are formed by, for example, a PEALD method. The second silicon nitride layer 122 and the second metal nitride layer 124 may be alternatively formed. The PEALD process may be performed using remote plasma of at a temperature of about 350° C. The PEALD process may be performed to prevent the sacrificial patterns 119 from being thermally damaged or deformed.

Next, a chemical mechanical polishing (CMP) process may be performed to polish the second silicon nitride layer 122 and the second metal nitride layer 124 and thereby to expose the top surfaces of the line patterns 110.

In exemplary embodiments, the insulating fences 120 may be formed of a silicon nitride layer which is doped with metallic impurities by a PEALD method (e.g., see FIG. 3). The metallic impurities may be reacted with nitrogen atoms in silicon nitride, and as a result of the reaction, a metal nitride material may be formed.

Figure 7A:
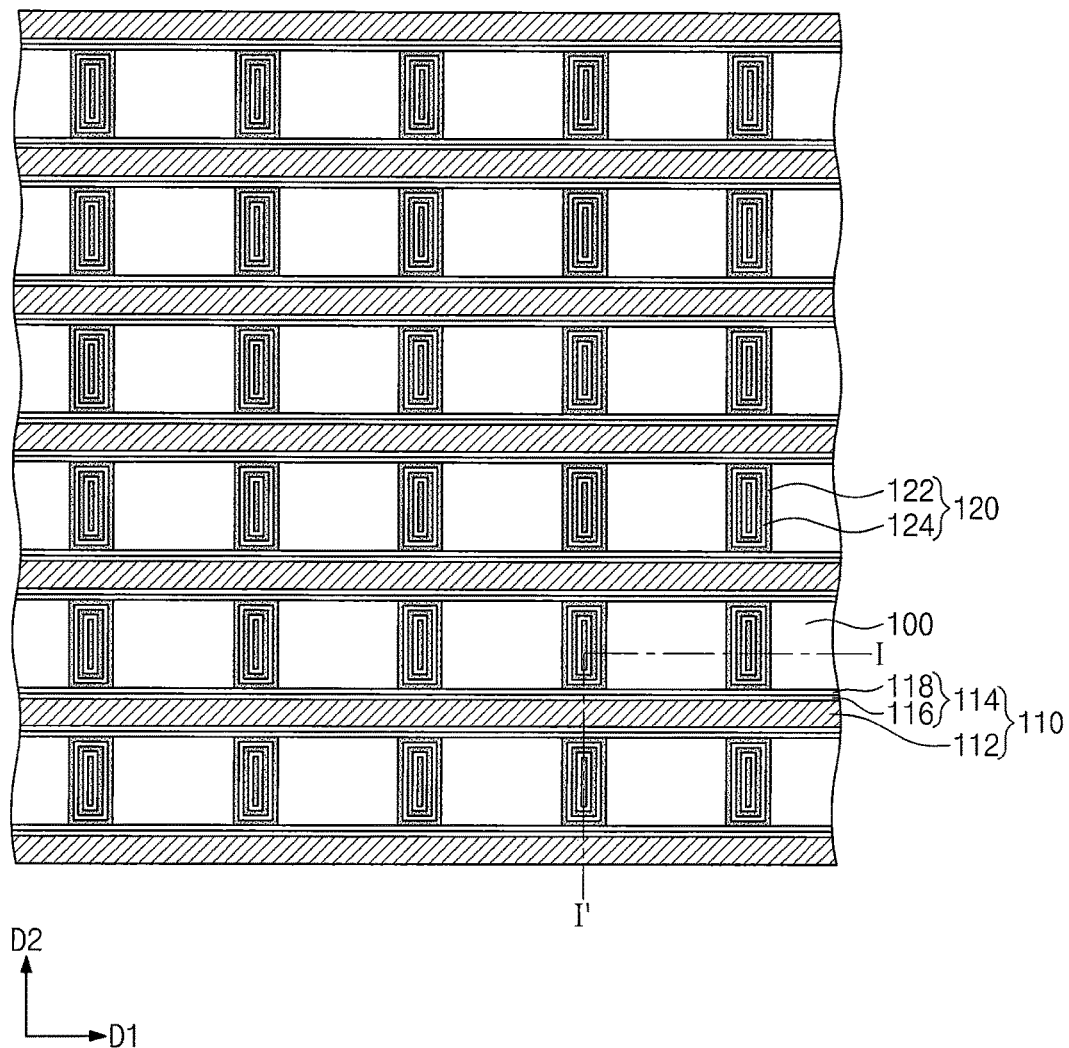
Figure 7B:
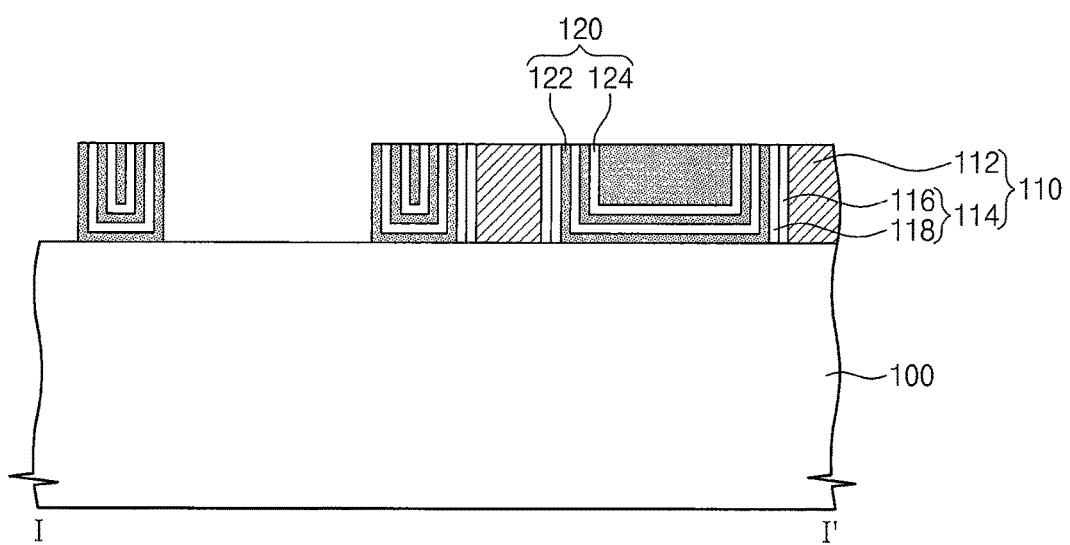

Referring to FIGS. 7A and 7B, the sacrificial patterns 119 may be removed. In exemplary embodiments, the sacrificial patterns 119 may be removed by a wet etching process. For example, an etchant for removing the sacrificial patterns 119 may contain acid solution, in which deionized water and hydrofluoric acid are mixed in a ratio of 100:1. The first silicon nitride layer 116, the first metal nitride layer 118, the second silicon nitride layer 122, the second metal nitride layer 124 may have an etch-resistant property with respect to the etchant for removing the sacrificial patterns 119. For example, the etch-resistant properties of the second silicon nitride layer 122 and the second metal nitride layer 124 may be dependent on a component ratio and/or thickness ratio therebetween.

FIG. 8 is a XPS data showing a change in an etch-resistant property according to a component ratio of the insulating fence 120, which was obtained in a process of removing the sacrificial patterns 119 of FIGS. 7A and 7B.

Referring to FIG. 8, the best etch-resistant property was obtained, when the etchant for removing the sacrificial patterns 119 was used for the second silicon nitride layer 122 and the second metal nitride layer 124 that were provided to have a component ratio of about 10:1.

For example, when the component ratio between the second silicon nitride layer 122 and the second metal nitride layer 124 was 20:1, 50:1, and 100:1, the etch rate of the insulating fences 120 was about 3.3 Å/min, 5.2 Å/min, and 9.2 Å/min, respectively. When the insulating fences 120 included only the second silicon nitride layer 122, the etch rate of the insulating fences 120 was about 14 Å/min. Accordingly, generally when the component ratio of the second metal nitride layer 124, with respect to the second silicon nitride layer 122, decreases, the etch rate of the insulating fences 120 may be increased. By contrast, when the component ratio of the second metal nitride layer 124, with respect to the second silicon nitride layer 122, increases, the etch rate of the insulating fences 120 may be decreased. When the second silicon nitride layer 122 and the second metal nitride layer 124 had a component ratio of about 10:1, the etch rate of the insulating fences 120 was about 1.5 Å/min. Nevertheless, the etch rate of the insulating fences 120 was higher when the insulating fences 120 included only the second metal nitride layer 124 compared to when the insulating fences 120 included the second silicon nitride layer 122 and the second metal nitride layer 124 in the component ratio of about 10:1. In particular, when the insulating fences 120 included only the second metal nitride layer 124, the etch rate of the insulating fences 120 was about 6.5 Å/min.

When the second silicon nitride layer 122 and the second metal nitride layer 124 has a component ratio of about 10:1, it is possible to remove the second silicon nitride layer 122 and the second metal nitride layer 124 from being damaged by the etchant when removing the sacrificial patterns 119. When the first silicon nitride layer 116 and the first metal nitride layer 118 has a component ratio of about 10:1, it is possible to minimize etching damage to the first silicon nitride layer 116 and the first metal nitride layer 118.

Referring back to FIGS. 1A and 1B, the conductive patterns 130 may be formed to fill gap regions (left by removal of the sacrificial patterns 119) between the line patterns 110 and between the insulating fences 120.

A conductive layer may be formed on the substrate 100 provided with the line patterns 110 and the insulating fences 120. The conductive layer may be polished to expose the line patterns 110 and the insulating fences 120, and as a result, the conductive patterns 130 may be formed in the gap regions, respectively.

Figure 9A:
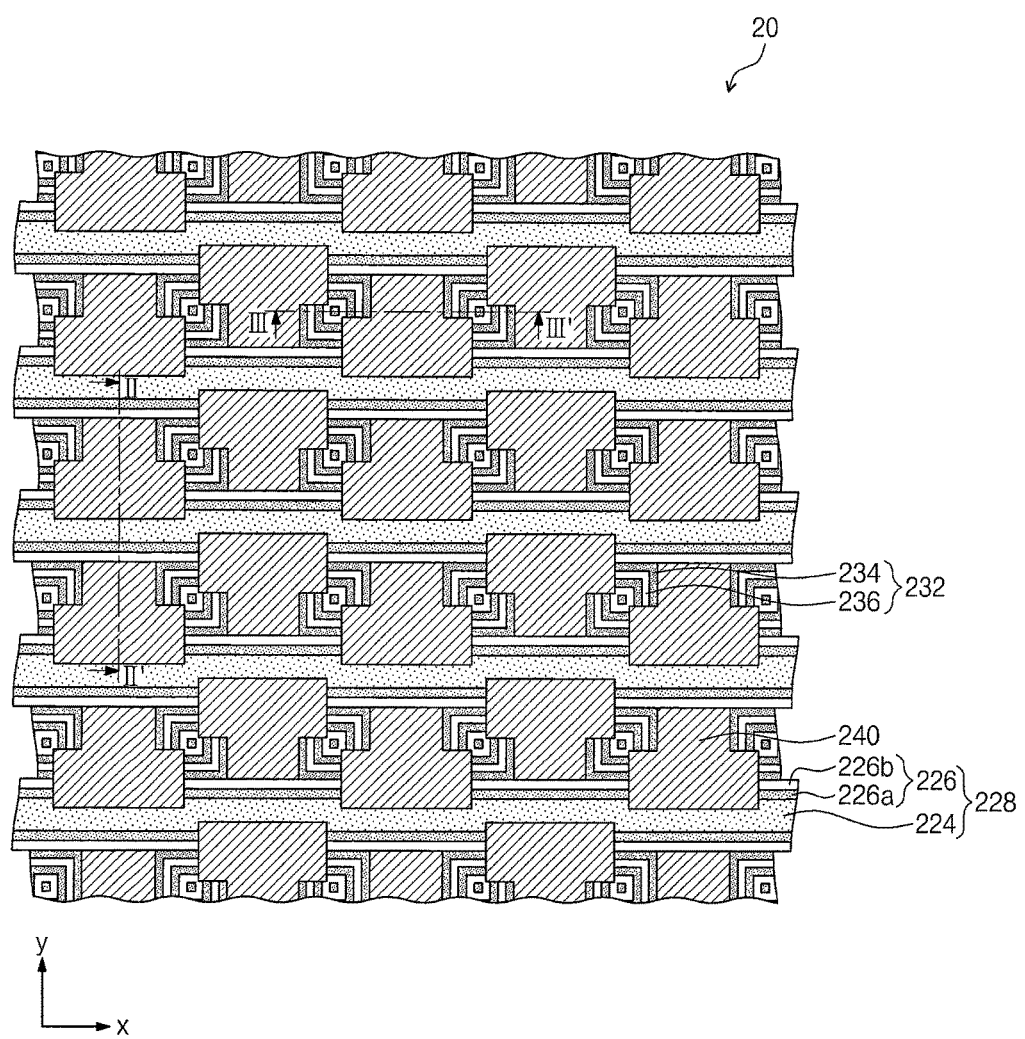
FIG. 9A is a plan view illustrating an example of a semiconductor device according to exemplary embodiments of the inventive concept.
Figure 9B:
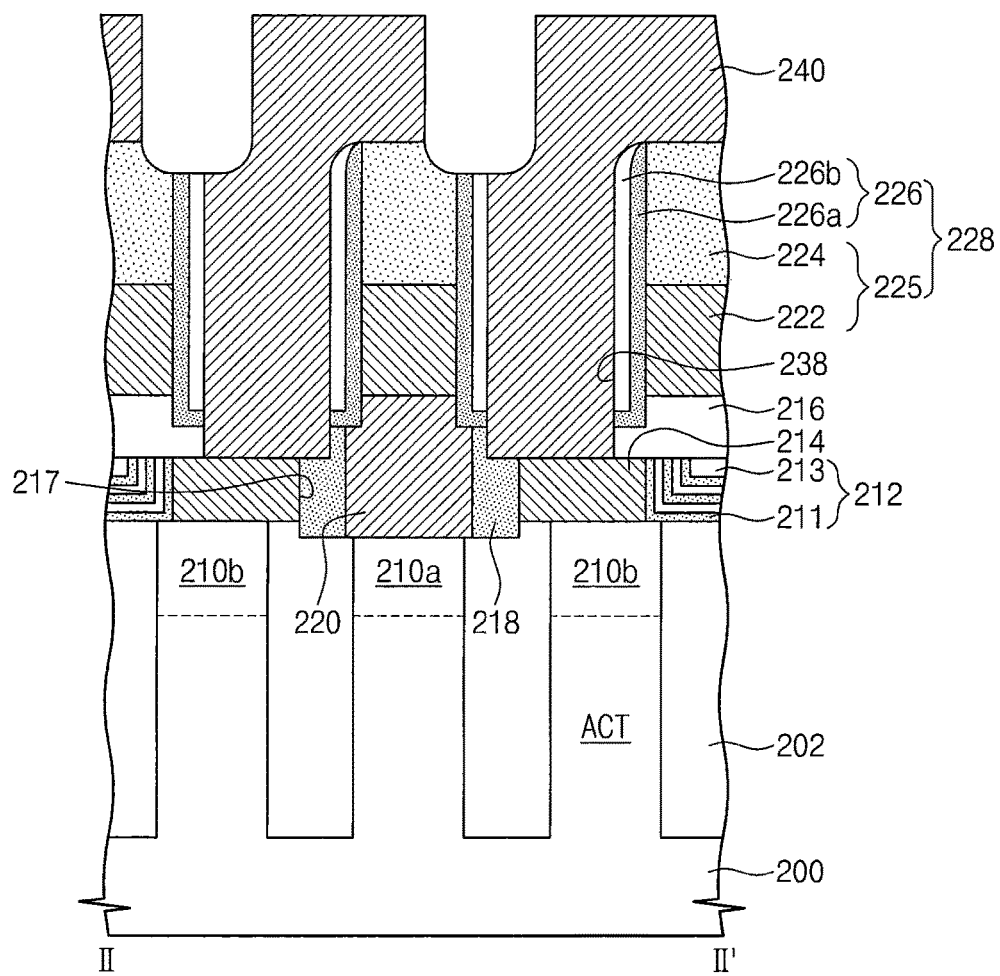
FIGS. 9B and 9C are sectional views taken along lines II-II' and III-III', respectively, of FIG. 9A.
Figure 9C:
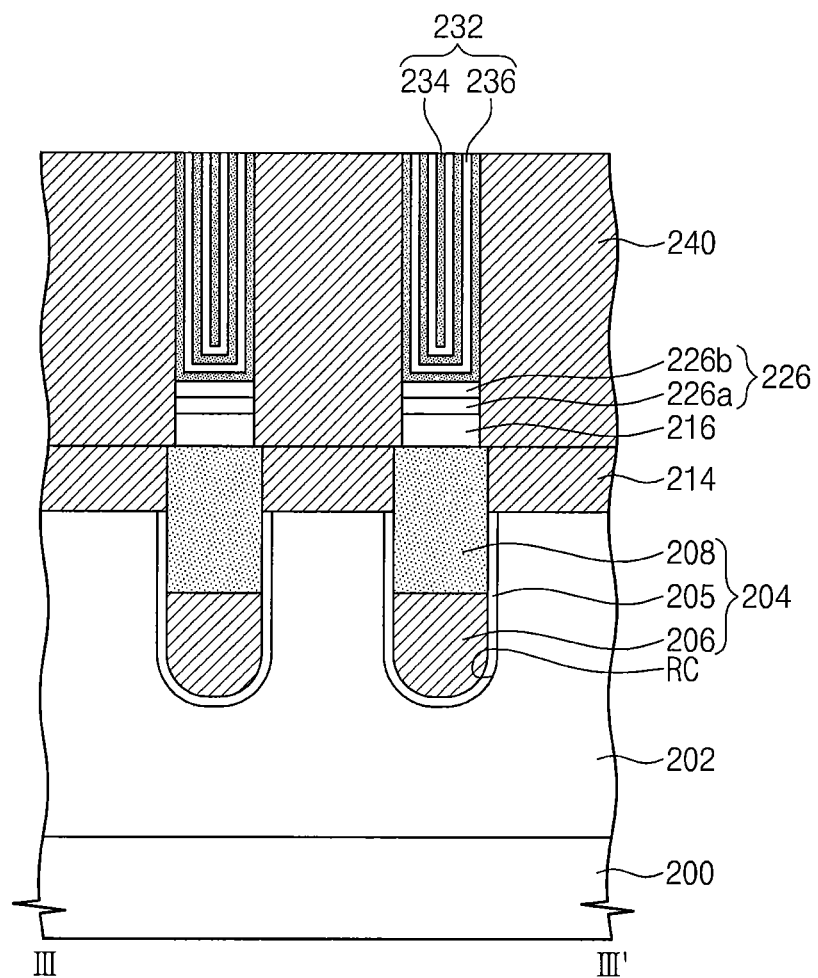

FIG. 9A is a plan view illustrating an example of the semiconductor device 20 according to exemplary embodiments of the inventive concept, and FIGS. 9B and 9C are sectional views taken along lines II-IP and III-III', respectively, of FIG. 9A.

Referring to FIGS. 9A to 9C, the semiconductor device 20 may be or include a memory device (e.g., DRAM device). In exemplary embodiments, the semiconductor device 20 may include a substrate 200, a device isolation layer 202, gate stacks 204, lower insulating fences 212, conductive pads 214, an interlayered insulating layer 216, a first spacer 218, first contact plugs 220, bit line structures 228, upper insulating fences 232, and second contact plugs 240.

The substrate 200 may include a silicon wafer.

The device isolation layer 202 may define active regions ACT of the substrate 200. Each of the active regions ACT may include a first impurity region 210a and a second impurity region 210b. The first and second impurity regions 210a and 210b may be doped to have the same conductive type. For example, the first and second impurity regions 210a and 210b may be doped with boron. In exemplary embodiments, the first and second impurity regions 210a and 210b may be doped with phosphorus or arsenic.

The gate stacks 204 may be disposed in the recesses RC, respectively. The recesses RC may extend in the y-direction. In exemplary embodiments, each of the gate stacks 204 may include a gate insulating pattern 205, a gate electrode 206, and a gate capping insulating pattern 208.

The gate insulating pattern 205 may be provided to cover bottom and side surfaces of each of the recesses RC. The gate insulating pattern 205 may have substantially uniform thickness. The gate insulating pattern 205 may be formed of or include at least one of oxide materials (e.g., silicon oxide).

The gate electrode 206 may be disposed on the gate insulating pattern 205. For example, the gate electrode 206 may be provided in a lower region of the recess RC. A top surface of the gate electrode 206 may be lower than that of the substrate 200. In exemplary embodiments, the gate electrode 206 may include at least one of doped polysilicon, metals, or metal compounds. For example, the gate electrode 206 may include at least one of tungsten (W), aluminum (Al), titanium (Ti), tantalum (Ta), titanium nitride (TiN), tantalum nitride (TaN), tungsten nitride (WN), or metal silicides.

The gate capping insulating pattern 208 may be disposed on the gate electrode 206. The gate capping insulating pattern 208 may be provided in an upper region of the recess RC. The gate capping insulating pattern 208 may be provided to include a portion protruding above the substrate 200. For example, the gate capping insulating pattern 208 may include at least one of nitride materials (e.g., silicon nitride) or oxynitride materials (e.g., silicon oxynitride).

The conductive pads 214 may be disposed on the second impurity regions 210b of the active regions ACT, respectively. The conductive pads 214 may be disposed between the gate stacks 204. The conductive pads 214 may be disposed spaced apart from each other in the x-direction. The conductive pads 214 may have top surfaces that are substantially coplanar with those of the gate capping insulating pattern 208. The conductive pads 214 may include at least one of doped polysilicon, metals, or metal compounds. For example, the conductive pads 214 may include at least one of tungsten (W), aluminum (Al), titanium (Ti), tantalum (Ta), titanium nitride (TiN), tantalum nitride (TaN), tungsten nitride (WN), or metal silicides.

The lower insulating fences 212 and the conductive pads 214 may be alternately arranged in the x-direction. The lower insulating fences 212 may reduce coupling signal interference and leakage current between the conductive pads 214, thereby increasing operational reliability of the semiconductor device. At least one of the lower insulating fences 212 may include a portion that is overlapped with a portion of the device isolation layer 202. In exemplary embodiments, each of the lower insulating fences 212 may include a portion that is overlapped with a portion of the second impurity region 210b. The lower insulating fences 212 may have top surfaces that are substantially coplanar with those of the gate capping insulating pattern 208 and the conductive pads 214. In exemplary embodiments, each of the lower insulating fences 212 may include a third silicon nitride layer 211 and a third metal nitride layer 213. For example, the third silicon nitride layer 211 and the third metal nitride layer 213 may be provided to have a component ratio and/or thickness ratio of about 10:1 and may be alternately stacked on the device isolation layer 202. The third metal nitride layer 213 may include aluminum nitride, hafnium nitride, or yttrium nitride. In exemplary embodiments, each of the lower insulating fences 212 may include a silicon nitride layer doped with metallic impurities. The metallic impurities may include at least one of aluminum, hafnium, or yttrium. The metallic impurities may be reacted with nitrogen atoms in the silicon nitride layer, and as a result of the reaction, a metal nitride material may be formed. The metal nitride material may include aluminum nitride, hafnium nitride, or yttrium nitride.

The interlayered insulating layer 216 may be disposed on the lower insulating fences 212. The interlayered insulating layer 216 may include a portion that is overlapped with at least one of the conductive pads 214. For example, the interlayered insulating layer 216 may include at least one of oxide materials (e.g., silicon oxide).

The first contact plugs 220 may be disposed on the first impurity region 210a. The first contact plugs 220 may have top surfaces that are substantially coplanar with that of the interlayered insulating layer 216. In exemplary embodiments, the first contact plugs 220 may include at least one of metals or metal compounds. For example, the first contact plugs 220 may include at least one of tungsten (W), copper (Cu), aluminum (Al), titanium (Ti), tantalum (Ta), titanium nitride (TiN), tantalum nitride (TaN), tungsten nitride (WN), or metal silicides.

The first spacer 218 may be disposed on a sidewall of the first contact plug 220. The first spacer 218 may be disposed on the device isolation layer 202 and around the first contact plug 220. The first spacer 218 may include a portion positioned on at least one of the first and second impurity regions 210a and 210b. For example, when viewed in a plan view, the first spacer 218 may be a ring-shaped structure enclosing each of the first contact plugs 220. The first spacer 218 and the first contact plug 220 may be disposed in a first contact hole 217.

The bit line structures 228 may be provided on the first contact plugs 220, the first spacer 218, and the interlayered insulating layer 216 and may extend in the x-direction. In exemplary embodiments, each of the bit line structures 228 may include a bit line stack 225 and a second spacer 226.

The bit line stacks 225 may be electrically connected to the first contact plugs 220. In exemplary embodiments, each of the bit line stacks 225 may include a bit line 222 and a bit line capping layer 224. The bit lines 222 may be electrically connected to the first contact plugs 220, respectively. In exemplary embodiments, the bit line 222 may include at least one of metals or metal compounds. For example, the bit line 222 may include at least one of tungsten (W), copper (Cu), aluminum (Al), titanium (Ti), tantalum (Ta), titanium nitride (TiN), tantalum nitride (TaN), tungsten nitride (WN), or metal silicides. The bit line capping layer 224 may be disposed on the bit line 222. For example, the bit line capping layer 224 may be formed of or include at least one of oxide materials (e.g., silicon oxide). In exemplary embodiments, the bit line capping layer 224 may be formed of or include at least one of nitride materials (e.g., silicon nitride or silicon oxynitride).

The second spacers 226 may be disposed on both sidewalls of each of the bit line stacks 225. The second spacers 226 may be disposed on the interlayered insulating layer 216 and the first spacer 218. The second spacer 226 may have a multi-layered structure. In exemplary embodiments, the second spacer 226 may include a fourth silicon nitride layer 226a and a fourth metal nitride layer 226b. The fourth silicon nitride layer 226a may be disposed on both sidewalls of each of the bit line stacks 225. The fourth silicon nitride layer 226a may be disposed on the interlayered insulating layer 216 and the first spacer 218. The fourth metal nitride layer 226b may be disposed on the fourth silicon nitride layer 226a. The fourth metal nitride layer 226b may be formed of or include at least one of aluminum nitride (AlN), hafnium nitride (HfN), or yttrium nitride (YiN). In exemplary embodiments, the second spacer 226 may be formed of or include a silicon nitride layer doped with metallic impurities. The metallic impurities may include at least one of aluminum, hafnium, or yttrium. The metallic impurities may be reacted with nitrogen atoms in the silicon nitride layer, and as a result of the reaction, a metal nitride material may be formed. The metal nitride material may include aluminum nitride, hafnium nitride, or yttrium nitride.

The upper insulating fences 232 may be provided between each pair of the bit line structures 228 and may be spaced apart from each other in the x-direction. The upper insulating fences 232 may have top surfaces that are substantially coplanar with those of the bit line stacks 225. The upper insulating fences 232 may be disposed between the second contact plugs 240. The upper insulating fences 232 may be disposed on the gate stacks 204. Alternatively, the upper insulating fences 232 may extend in the y-direction between the bit line structures 228. In exemplary embodiments, each of the upper insulating fences 232 may include a fifth silicon nitride layer 234 and a fifth metal nitride layer 236. The fifth silicon nitride layer 234 and the fifth metal nitride layer 236 may be provided to have a component ratio and/or thickness ratio of about 10:1 and may be alternately stacked. The fifth metal nitride layer 236 may be formed of or include aluminum nitride (AlN), hafnium nitride (HfN), or yttrium nitride (YiN). Alternatively, the fifth metal nitride layer 236 may be formed of or include a silicon nitride layer doped with metallic impurities. The metallic impurities may include at least one of aluminum, hafnium, or yttrium. The metallic impurities may be reacted with nitrogen atoms in the silicon nitride layer, and as a result of the reaction, a metal nitride material may be formed. The metal nitride material may include aluminum nitride, hafnium nitride, or yttrium nitride.

The second contact plugs 240 may be provided between each pair of the bit line structures 228. The second contact plugs 240 may be disposed in second contact holes 238. Each of the second contact holes 238 may be defined by a pair of the bit line structures 228 and a pair of the upper insulating fences 232. In exemplary embodiments, the second contact plugs 240 and the upper insulating fences 232 may be alternately arranged in the x-direction. Each of the upper insulating fences 232 may electrically separate a pair of the second contact plugs 240 adjacent thereto from each other. For example, each of the second contact plugs 240 may be disposed between a pair of the bit line structures 228 and between the upper insulating fences 232, which are disposed between the pair of the bit line structures 228. When viewed in a plan view, the second contact plugs 240 may be disposed spaced apart from each other in two different directions to form a plurality of rows and a plurality of columns. The rows may be parallel to an x-direction, and the columns may be parallel to a y-direction. The second contact plugs 240 may be disposed on the conductive pads 214, respectively. The second contact plugs 240 may be electrically connected to the conductive pads 214, respectively. The second contact plugs 240 may have top surfaces that are higher than those of the bit line structures 228. At least one of the second contact plugs 240 may include a portion that is overlapped with a portion of the bit line structure 228. The second spacers 226 and the upper insulating fences 232 may make it possible to reduce the coupling signal interference and the leakage current, and thus, it is possible to improve electric reliability of the second contact plugs 240.

Data storage structures may be disposed on the second contact plugs 240, respectively. The data storage structures may be electrically connected to the second contact plugs 240. The data storage structures may be configured to store data therein. Each of the data storage structures may be electrically connected to a corresponding one of the second impurity regions 210b through the second contact plug 240 and the conductive pad 214. The data storage structure and a selection component connected thereto may provide a memory cell, and in this case, the semiconductor device according to exemplary embodiments of the inventive concept may be used as a semiconductor memory device. The data storage structure may be one of various types of memory cells.

A method of fabricating the semiconductor device 20 will be described below.

FIGS. 10A to 20A are plan views illustrating a method of fabricating the semiconductor device 10 of FIG. 9A. FIGS. 10B to 20B are sectional views taken along line II-II' of FIGS. 10A to 17A, respectively, and FIGS. 10C to 20C are sectional views taken along line III-III' of FIGS. 10A to 17A, respectively.

Figure 10A:
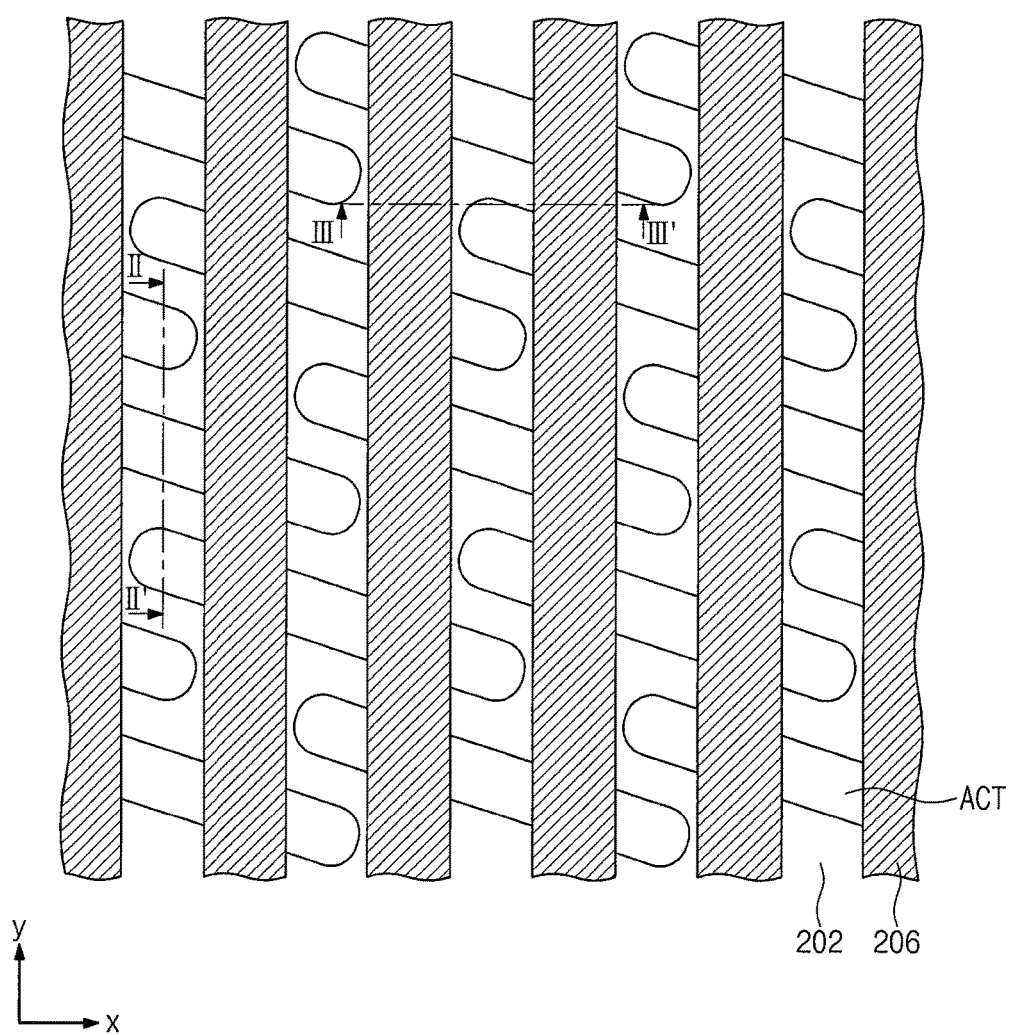
Figure 10B:
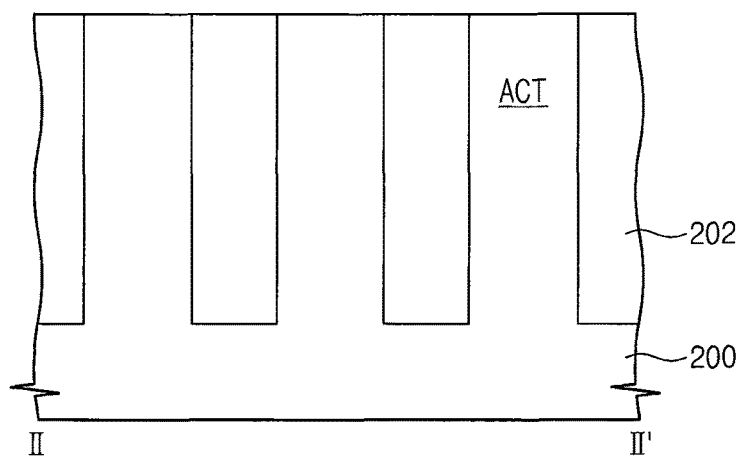
Figure 10C:
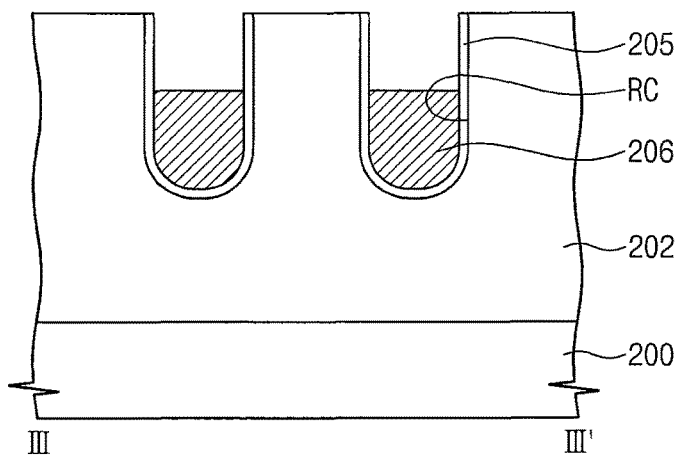

Referring to FIGS. 10A to 10C, a gate insulating pattern 205 and a gate electrode 206 may be formed on a substrate 200 provided with a device isolation layer 202.

In detail, the substrate 200 may be etched to form a trench, and the trench may be filled with an insulating material serving as the device isolation layer 202. The insulating material may be formed of or include at least one of oxide materials (e.g., silicon oxide). The substrate 200 may include active regions ACT defined the device isolation layer 202.

A structure of the active region ACT is described in more detail below, but the inventive concept is not limited thereto.

When viewed in a plan view, the active regions ACT may be disposed to be spaced apart from each other in two different directions and thereby to form a plurality of rows and a plurality of columns. The rows may be parallel to an x-direction, and the columns may be parallel to a y-direction. In exemplary embodiments, the rows may include first, second, and third rows that are adjacent to each other. Each of portions of the active regions ACT of the first row may be disposed between portions of the active regions ACT of the second row. Each of portions of the active regions ACT of the third row may disposed between portions, of the active regions ACT of the second row. Here, the active regions ACT constituting the first to third rows may be spaced apart from each other. When viewed in a plan view, each of the active regions ACT may have an elliptical shape. Each of the active regions ACT may have a major axis that is non-perpendicular and non-parallel to the x-axis.

Next, the device isolation layer 202 and the active regions ACT may be patterned to form recesses RC. In exemplary embodiments, a pair of recesses RC may be formed to cross each of the active regions ACT. The recesses RC may extend in the y-direction and may be spaced apart from each other in the x-direction. A bottom surface of each of the recesses RC may include a first bottom defined by the recessed portion of the active region ACT and a second bottom defined by the recessed portion of the device isolation layer 202. Here, the second bottom may be lower than the first bottom.

Thereafter, a gate insulating layer may be conformally formed on the substrate 200. The gate insulating layer may be formed in the recesses RC. The gate insulating layer may be formed by a rapid thermal treatment process (RTP) or a chemical vapor deposition process.

Next, a conductive material may be formed on the gate insulating layer. The conductive material may be formed to fill the recesses RC. The conductive material and the gate insulating layer may be polished and planarized to expose the top surface of the substrate 200. And, the gate insulating pattern 205 and the gate electrode 206 may be formed by removing the conductive material from upper regions of the recesses RC.

The gate electrode 206 may be formed to face a bottom surface and both side surfaces of the recessed portion of the active regions ACT. In other words, since a channel region is defined by the gate electrode 206, the bottom and side surfaces of the recessed portion of the active regions ACT may be used as the channel region of the selection component or the field effect transistor. Accordingly, the channel region may have a three-dimensional structure, and this may make it possible to increase a width of the channel region within a given planar area. For example, the conductive material may include doped polysilicon, metals, and metal compounds. For example, the conductive material may include at least one of tungsten (W), aluminum (Al), titanium (Ti), tantalum (Ta), titanium nitride (TiN), tantalum nitride (TaN), tungsten nitride (WN), or metal silicides.

Figure 11A:
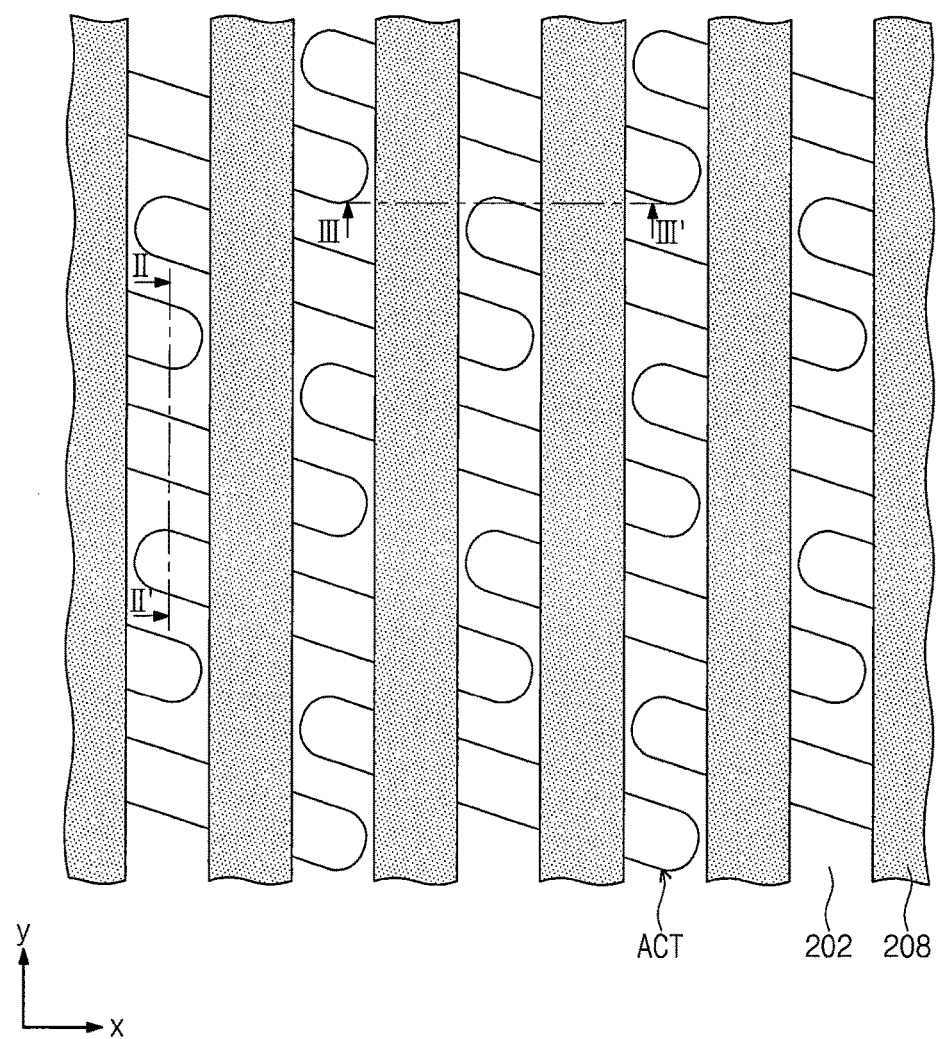
Figure 11B:
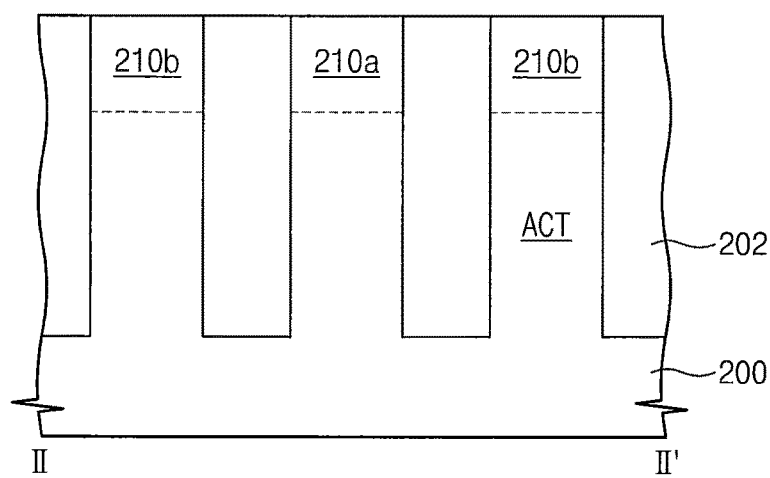
Figure 11C:
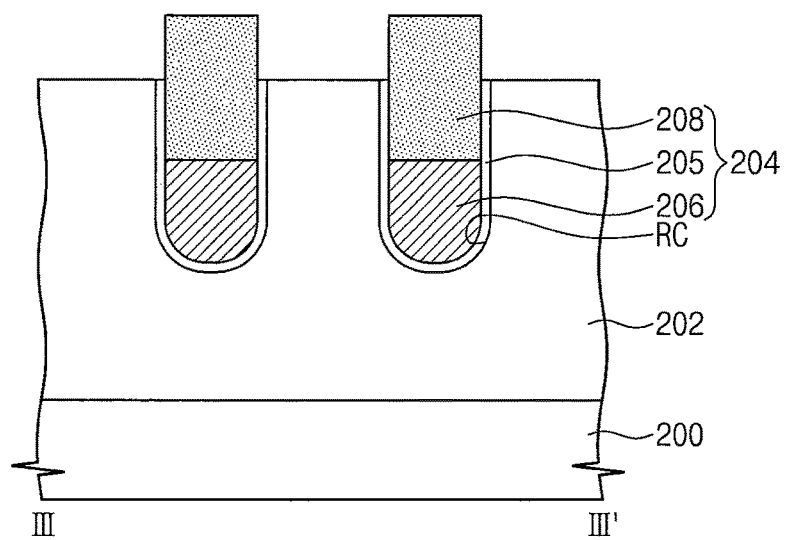

Referring to FIGS. 11A to 11C, a gate capping insulating pattern 208 may be formed on the gate electrode 206, and first and second impurity regions 210a and 210b may be formed.

In detail, an insulating material may be formed on the substrate 200 provided with the gate electrode 206. The gate capping insulating pattern 208 may be formed by removing the insulating material from regions around the recesses RC. The gate capping insulating pattern 208 may be formed to fill upper regions of the recesses RC and to have a top surface higher than that of the substrate 200. As a result, gate stacks 204 may be formed in the recesses RC. The insulating material may include at least one of nitride materials (e.g., silicon nitride) or oxynitride materials (e.g., silicon oxynitride). In exemplary embodiments, the gate capping insulating pattern 208 may be formed to have substantially the same width as the gate electrode 206.

Thereafter, the active regions ACT exposed by the gate capping insulating pattern 208 may be doped with impurities using the gate capping insulating pattern 208 as a mask to form the first and second impurity regions 210a and 210b.

In exemplary embodiments, since a pair of the gate electrode 206 are formed to cross each of the active regions ACT, the first impurity region 210a may be formed between the pair of the gate electrodes 206, and the second impurity regions 210b may be formed in opposite ends of the active regions ACT.

In exemplary embodiments, the first impurity region 210a may be formed in a portion of each active region ACT between the pair of the gate electrodes 206, and a pair of the second impurity regions 210b may be formed in opposite edge regions, respectively, of each active region ACT. In other words, when viewed in a plan view, a pair of the gate electrodes 206 may be formed between a pair of the second impurity regions 210b. Each gate electrode 206 and the first and second impurity regions 210a and 210b adjacent thereto may provide a selection component. That is, a pair of selection components may be formed on each of the active regions ACT. That is, the selection component may be provided in the form of a field effect transistor. Also, the pair of the selection components may share the first impurity region 210a therebetween. Since the gate electrode 206 is provided in the recess RC, it is possible to increase a channel length of the selection component or the field effect transistor within a given planar area. As a result, it is possible to suppress a short channel effect. In exemplary embodiments, the first and second impurity regions 210a and 210b may be formed in advance before the formation of the gate stacks 204.

Figure 12A:
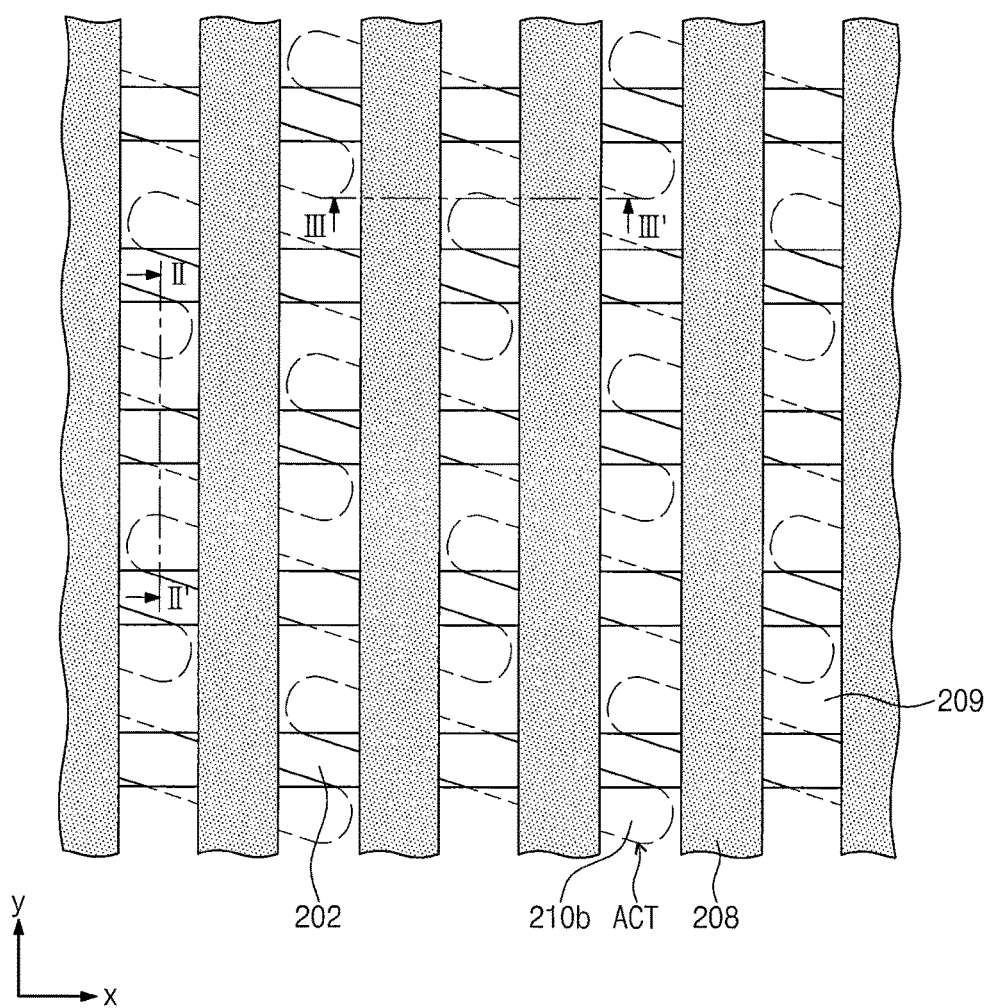
Figure 12B:
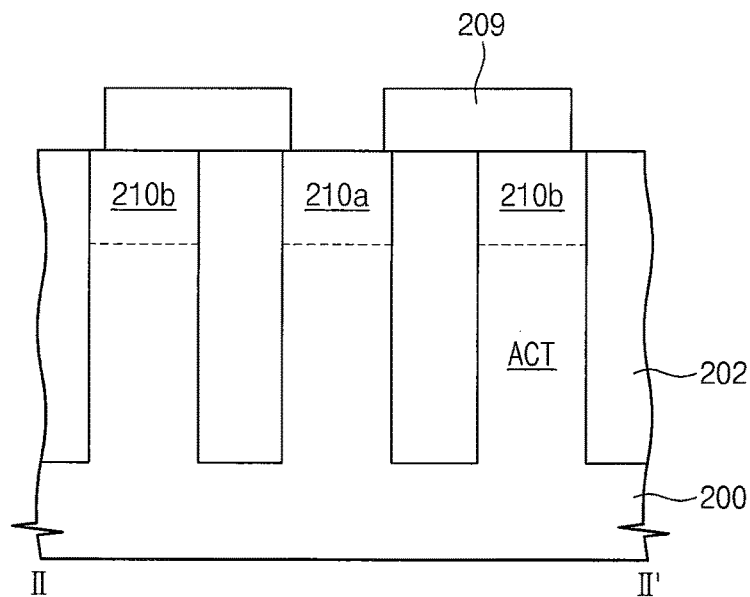
Figure 12C:
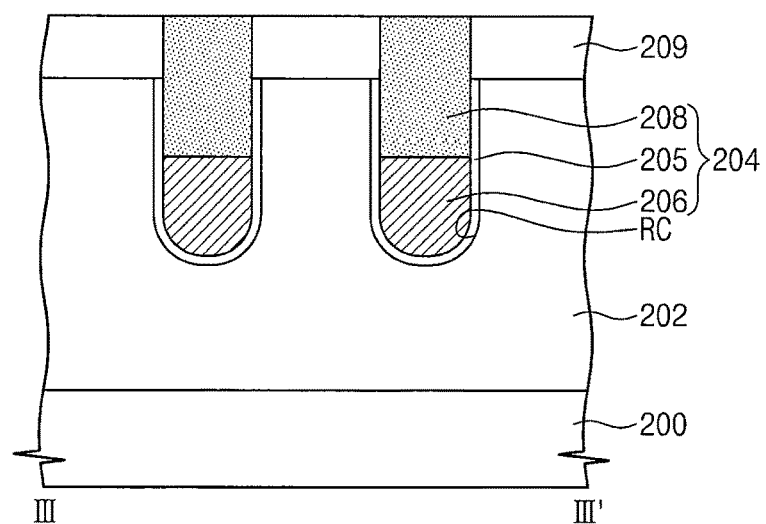

Referring to FIGS. 12A to 12C, on the second impurity regions 210b and the device isolation layer 202 between the gate capping insulating patterns 208, first sacrificial patterns 209 may be formed to be spaced apart from each other in the x-direction.

For example, the first sacrificial patterns 209 may be formed of or include at least one of oxide materials (e.g., silicon oxide), which may be formed by a chemical vapor deposition method. Alternatively, the first sacrificial patterns 209 may be formed through a spin coating process, a photolithography process, and an etching process.

Figure 13A:
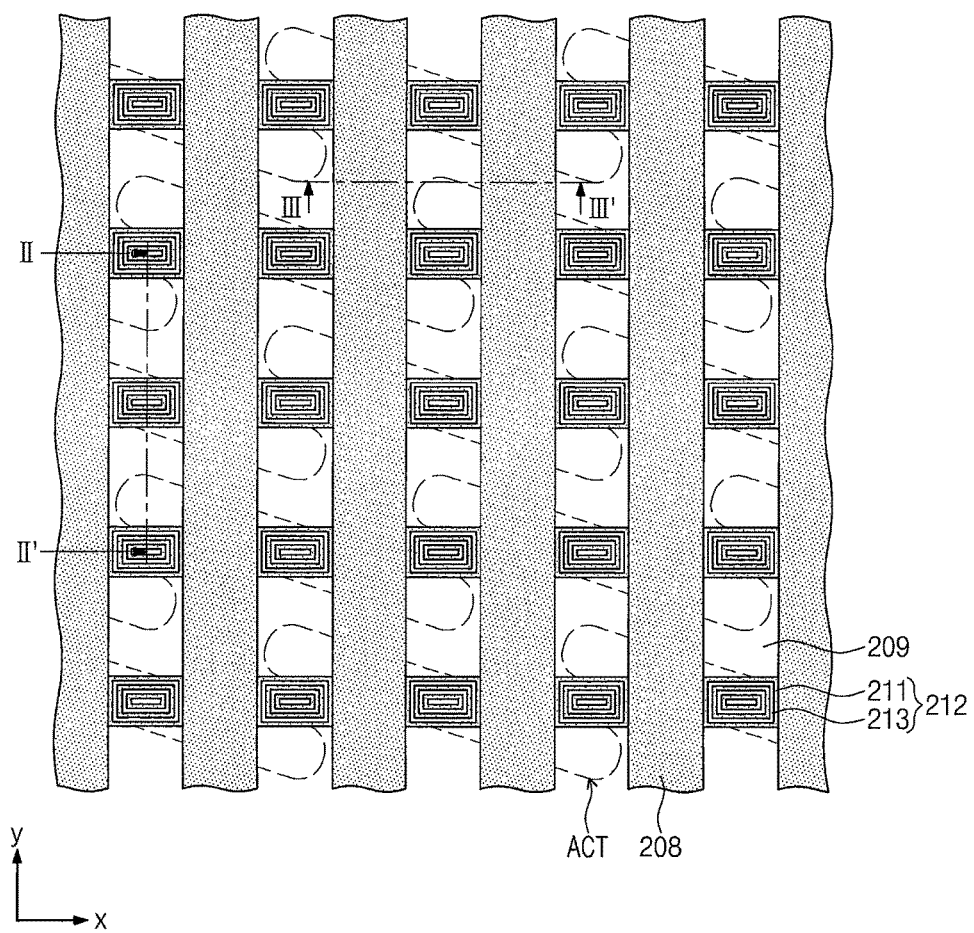
Figure 13B:
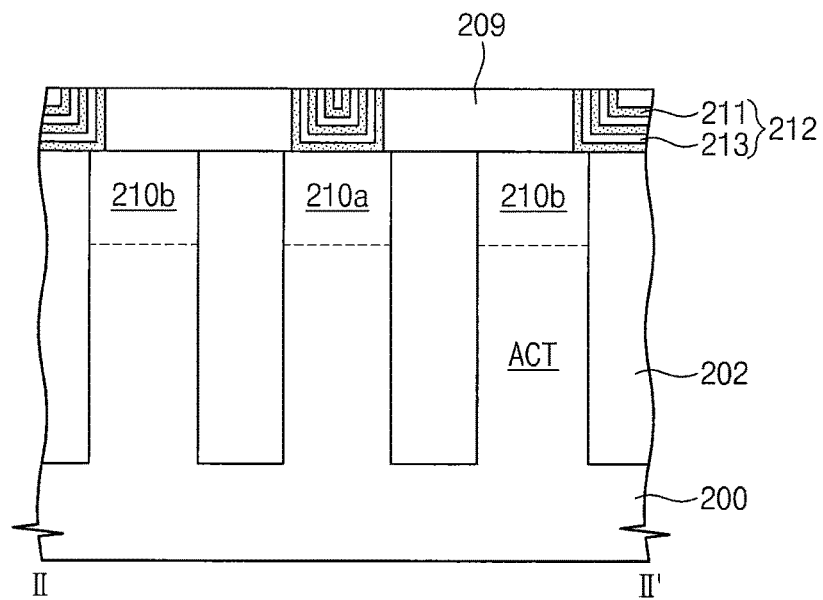
Figure 13C:
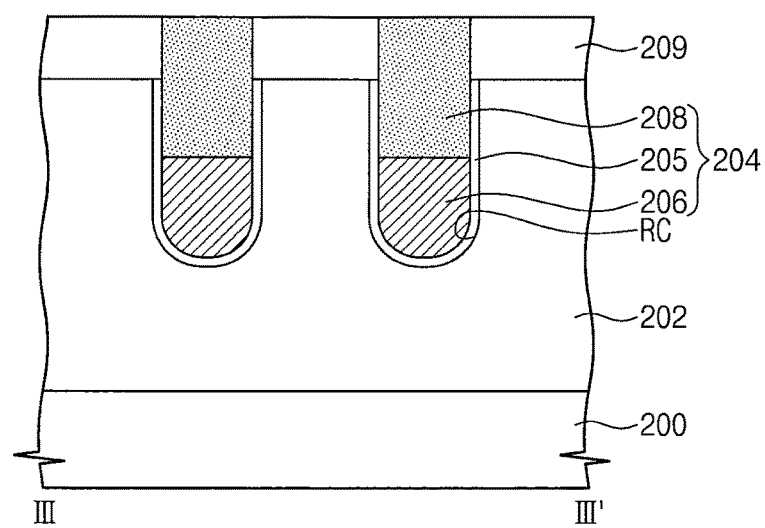

Referring to FIGS. 13A to 13C, lower insulating fences 212 may be formed between the gate capping insulating patterns 208.

For example, between each pair of the gate capping insulating pattern 208, the lower insulating fences 212 may be formed to be spaced apart from each other in the x-direction. Each of the lower insulating fences 212 may include a third silicon nitride layer 211 and a third metal nitride layer 213. In exemplary embodiments, the third silicon nitride layer 211 and the third metal nitride layer 213 may be formed using a PEALD process. The use of the PEALD process may make it possible to minimize deformation of the first sacrificial patterns 209. The third silicon nitride layers 211 and the third metal nitride layers 213 may be alternately formed. The third silicon nitride layer 211 and the third metal nitride layer 213 may be formed to have a component ratio of about 10:1. Alternatively, the third silicon nitride layer 211 and the third metal nitride layer 213 may be formed to have thickness ratio of about 10:1.

Figure 14A:
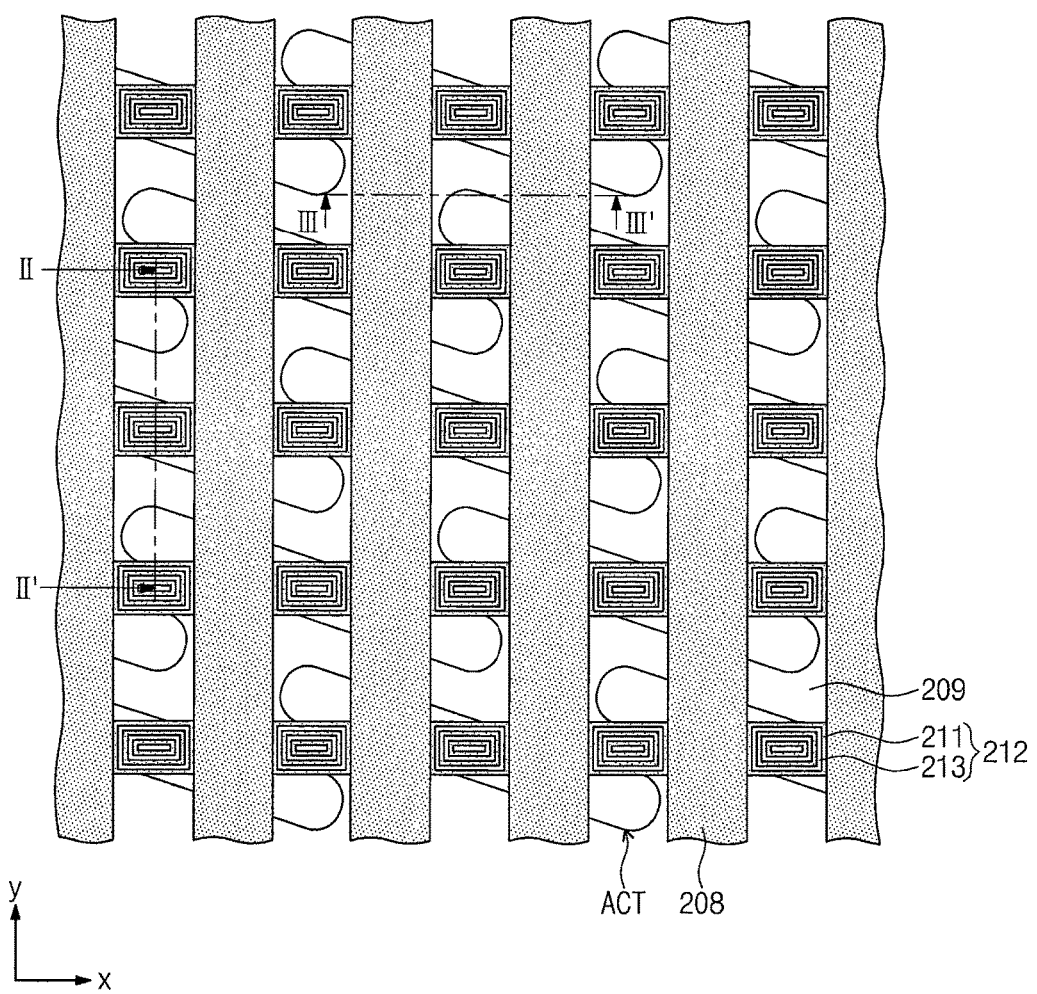
Figure 14B:
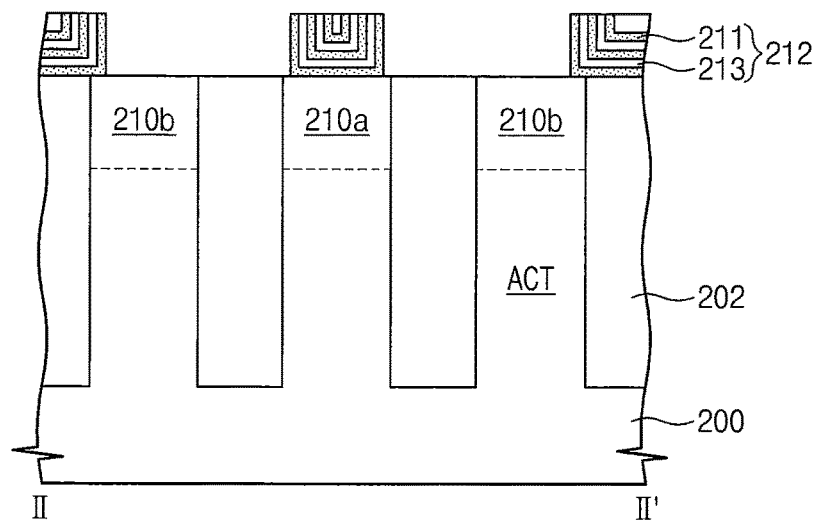
Figure 14C:
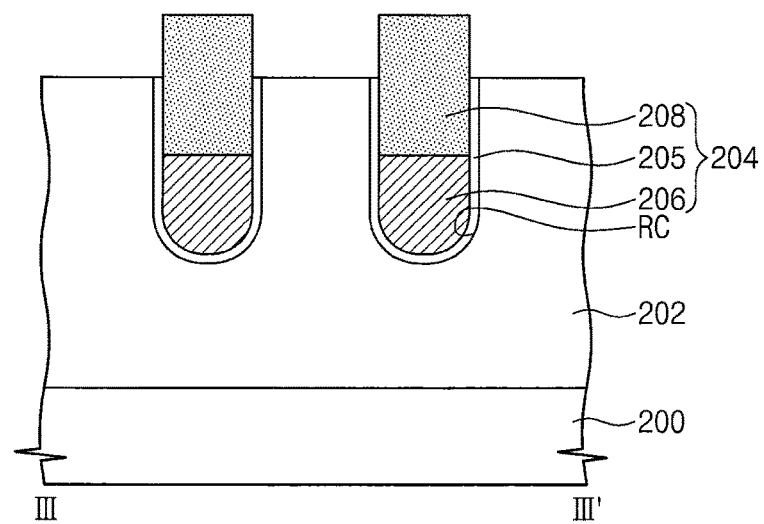

Referring to FIGS. 14A to 14C, the first sacrificial patterns 209 may be removed.

The first sacrificial patterns 209 may be removed using a wet etching process. A portion of the device isolation layer 202 and the second impurity regions 210b may be exposed between the gate capping insulating pattern 208 and the lower insulating fences 212. In exemplary embodiments, the third silicon nitride layer 211 and the third metal nitride layer 213 may be formed to have a high etch-resistant property to the wet etch used to remove the first sacrificial patterns 209. For example, an etchant for removing the first sacrificial patterns 209 may contain strong acid solution, in which deionized water and hydrofluoric acid are mixed in a ratio of 100:1.

The lower insulating fences 212 may be formed to have a high etch-resistant property to an etchant for removing the first sacrificial patterns 209. The lower insulating fences 212 may not be damaged by the etchant for removing the first sacrificial patterns 209.

Figure 15A:
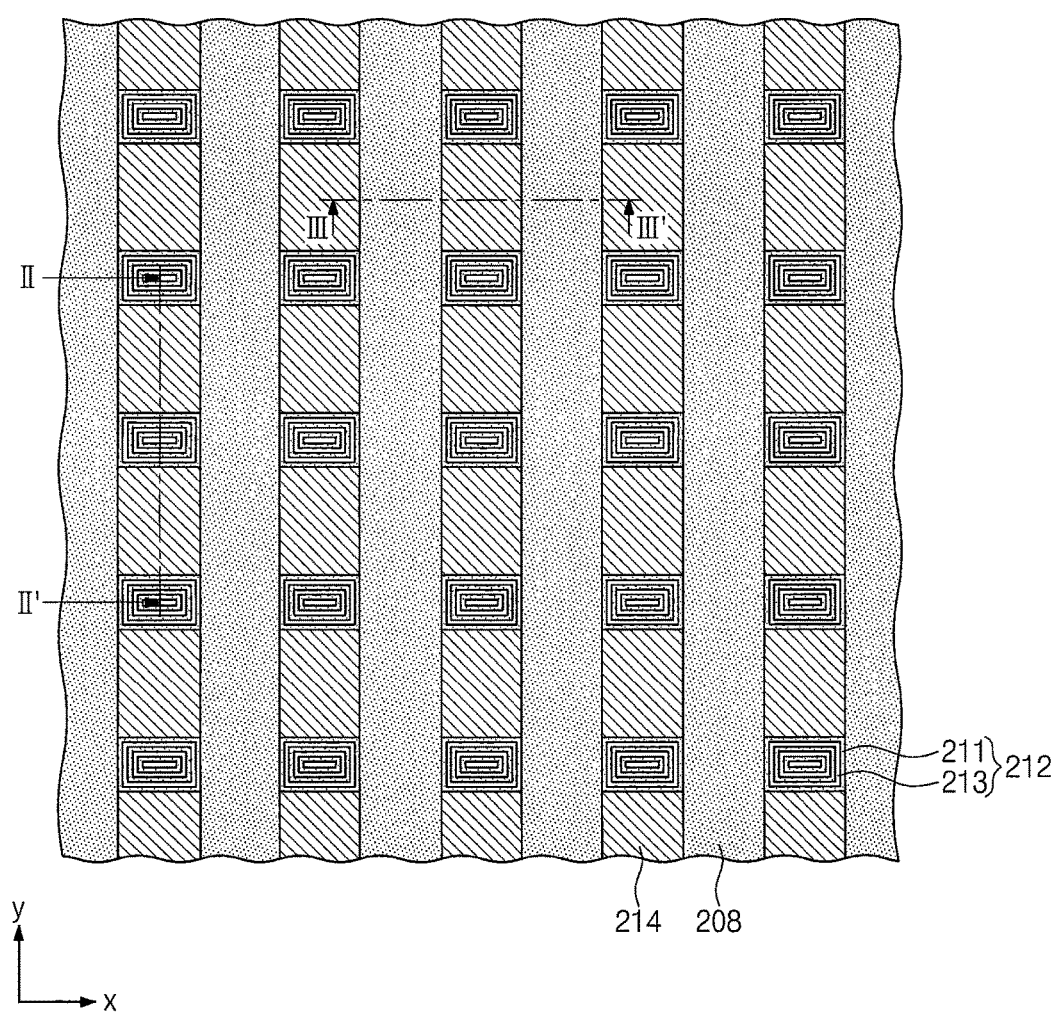
Figure 15B:
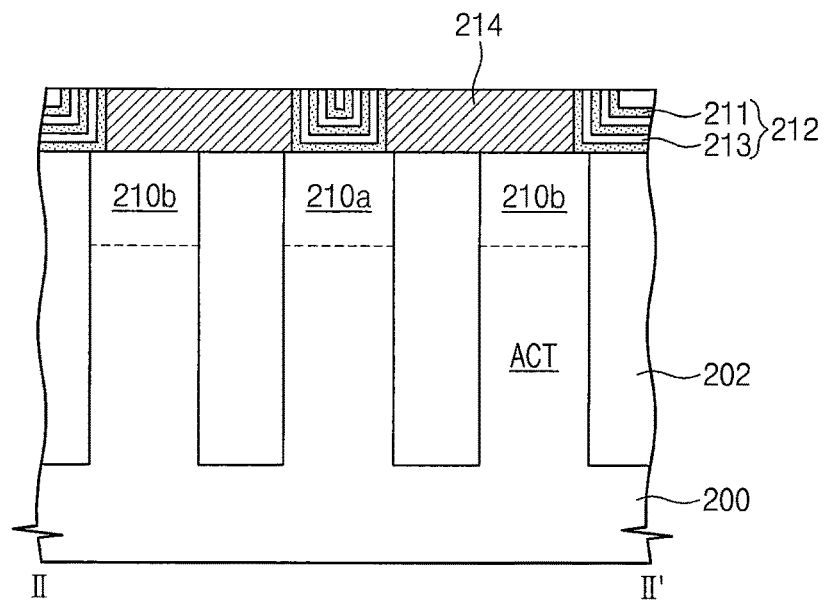
Figure 15C:
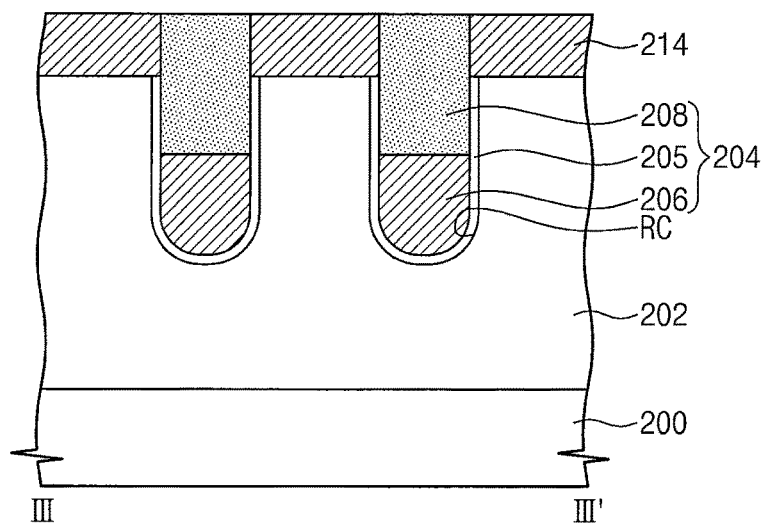

Referring to FIGS. 15A to 15C, conductive pads 214 may be respectively formed on the exposed portions of the second impurity regions 210b.

The conductive pads 214 may be formed by forming a conductive layer on the gate capping insulating pattern 208, the lower insulating fences 212, and the substrate 200, and then, polishing the conductive layer to expose the gate capping insulating pattern 208 and the lower insulating fences 212. The conductive layer may include at least one of doped polysilicon, metals, or metal compounds. The conductive layer may include at least one of tungsten (W), aluminum (Al), titanium (Ti), tantalum (Ta), titanium nitride (TiN), tantalum nitride (TaN), tungsten nitride (WN), or metal silicides.

Figure 16A:
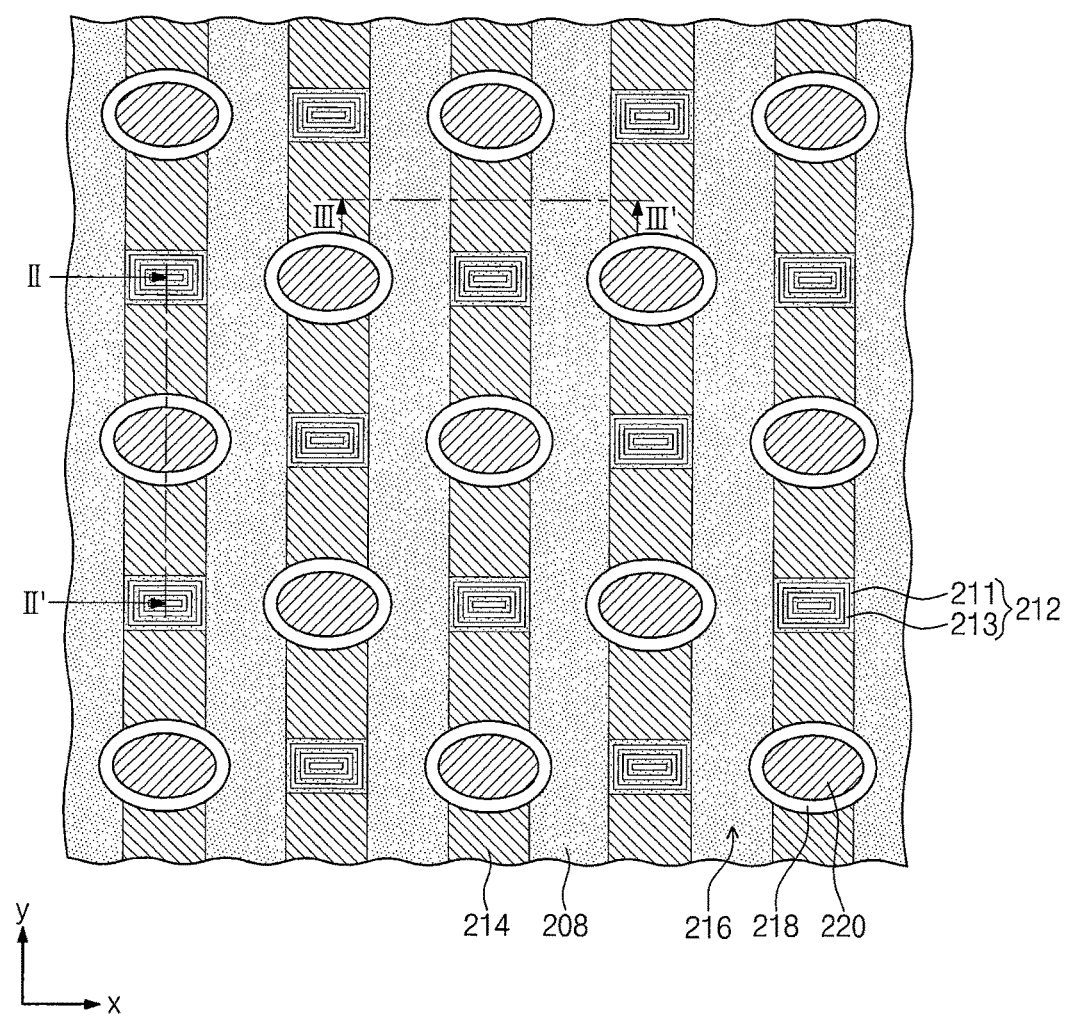
Figure 16B:
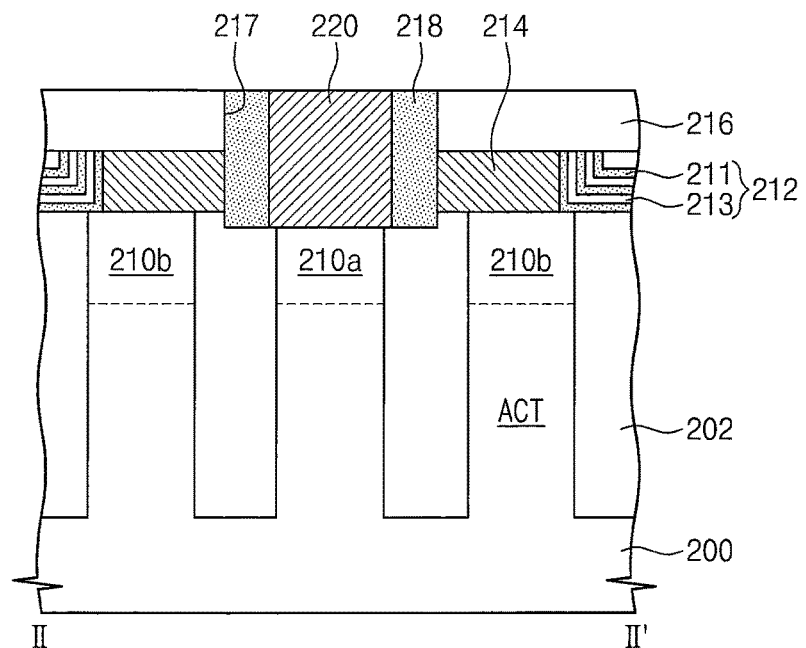
Figure 16C:
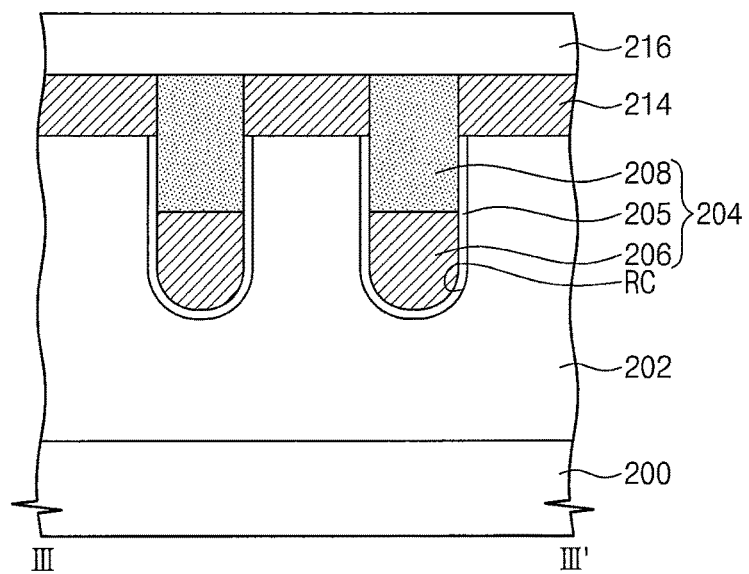

Referring to FIGS. 16A to 16C, first contact plugs 220 may be formed to be electrically connected to the first impurity regions 210a.

In detail, an interlayered insulating layer 216 may be formed on the gate capping insulating pattern 208, the lower insulating fences 212, and the conductive pads 214. The interlayered insulating layer 216 may include at least one of oxide materials (e.g., silicon oxide). The interlayered insulating layer 216 and the lower insulating fences 212 may be etched to expose the first impurity region 210a and to form first contact holes 217. The gate capping insulating pattern 208 and the conductive pads 214 may be partially etched to increase a contact area between the first impurity region 210a and the first contact plug 220.

First spacers 218 may be formed on inner side surfaces of the first contact holes 217. The first spacers 218 may include at least one of nitride materials (e.g., silicon nitride). A conductive material may be formed to fill the first contact holes 217 provided with the first spacers 218, and as a result, the first contact plugs 220 may be formed in the first contact holes 217. The conductive material may include at least one of doped polysilicon, metals, or metal compounds.

Figure 17A:
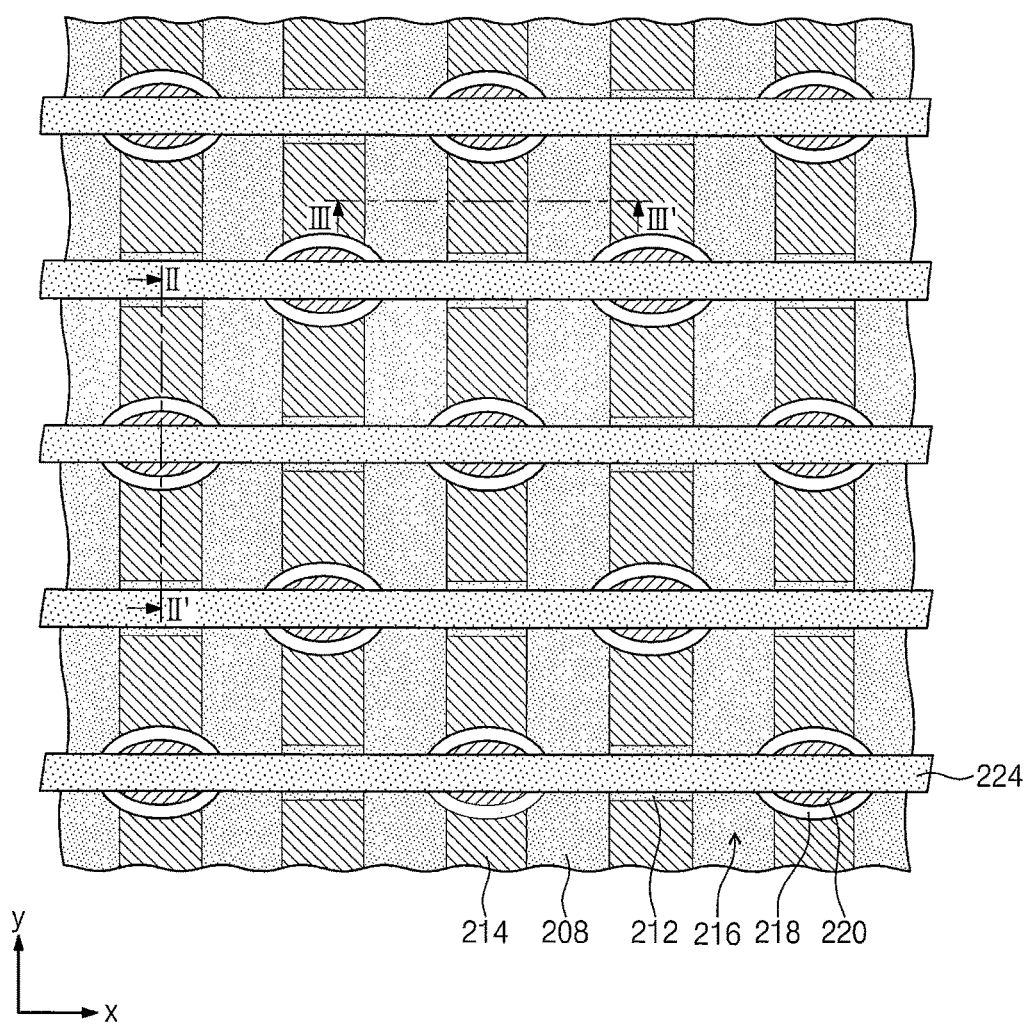
Figure 17B:
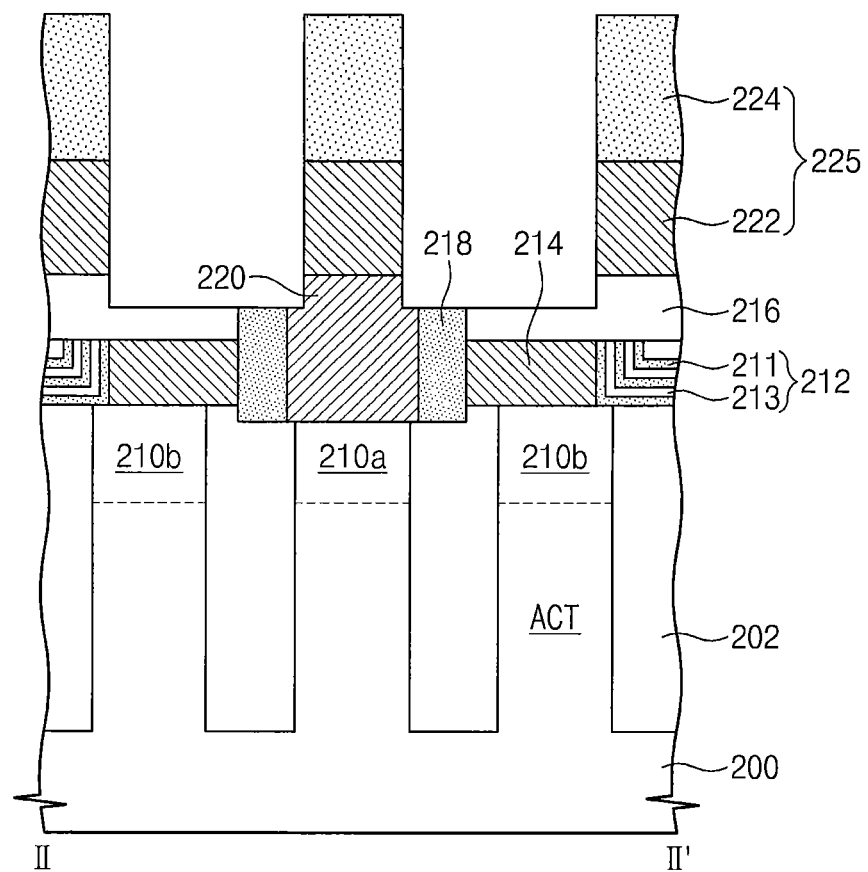
Figure 17C:
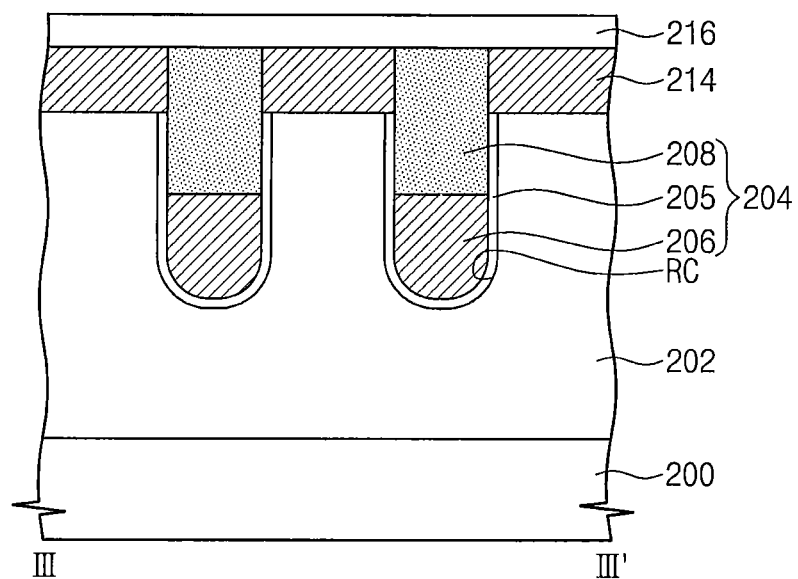

Referring to FIGS. 17A to 17C, bit line stacks 225 electrically connected to the first contact plugs 220 may be formed.

In detail, a conductive layer and an insulating layer may be sequentially formed on the first contact plugs 220 and the interlayered insulating layer 216. In exemplary embodiments, the conductive layer may include at least one of metals or metal compounds. The insulating layer may include at least one of nitrides (e.g., silicon nitride or silicon oxynitride). The conductive layer may include at least one of tungsten (W), aluminum (Al), titanium (Ti), tantalum (Ta), titanium nitride (TiN), tantalum nitride (TaN), tungsten nitride (WN), or metal silicides.

Next, the conductive layer and the insulating layer may be patterned to form the bit line stacks 225 extending in the x-direction. Each of the bit line stacks 225 may be electrically connected to the first contact plugs 220 which are arranged in the x-direction. Each of the bit line stacks 225 may include a bit line 222 and a bit line capping layer 224. In exemplary embodiments, the first contact plugs 220 may be partially etched during the patterning of the conductive layer and the insulating layer. Accordingly, upper portions of the first contact plugs 220 may have substantially the same width as those of the bit line stacks 225. In addition, lower portions of the first contact plugs 220 may be wider than those of the bit line stacks 225.

Figure 18A:
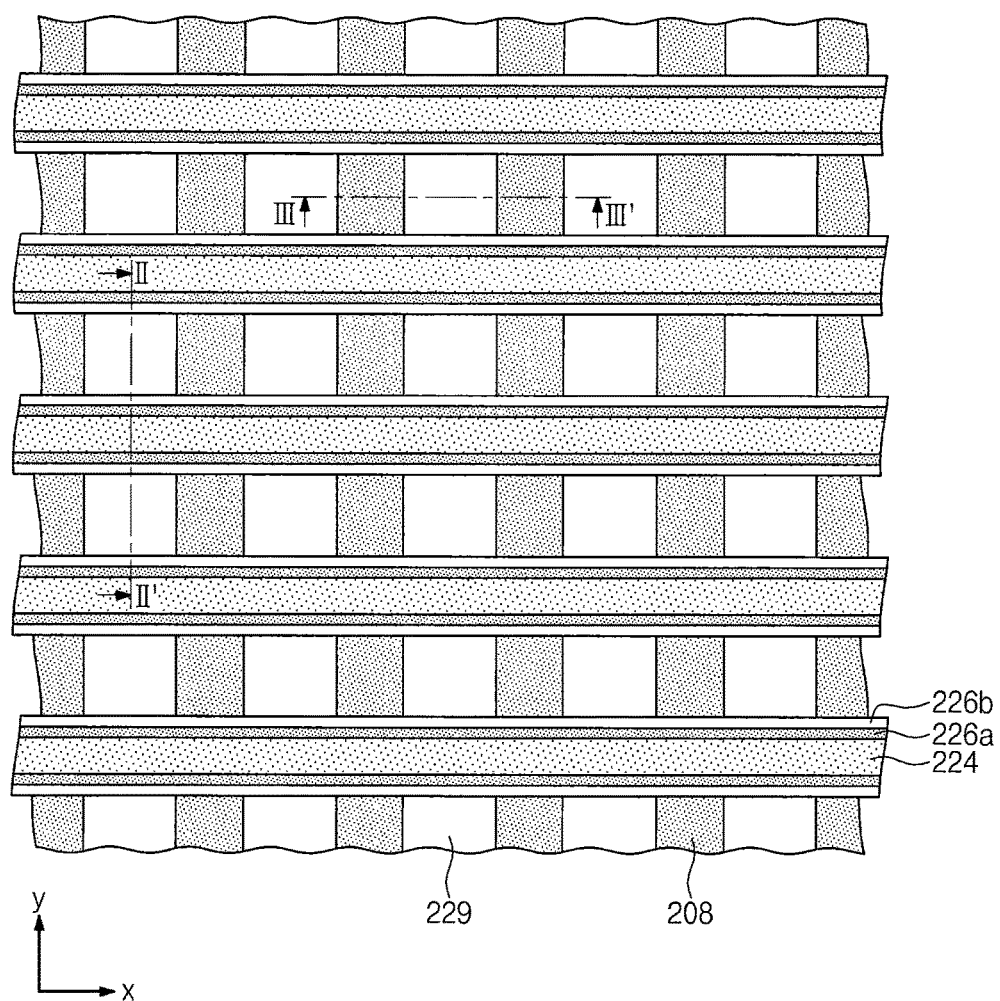
Figure 18B:
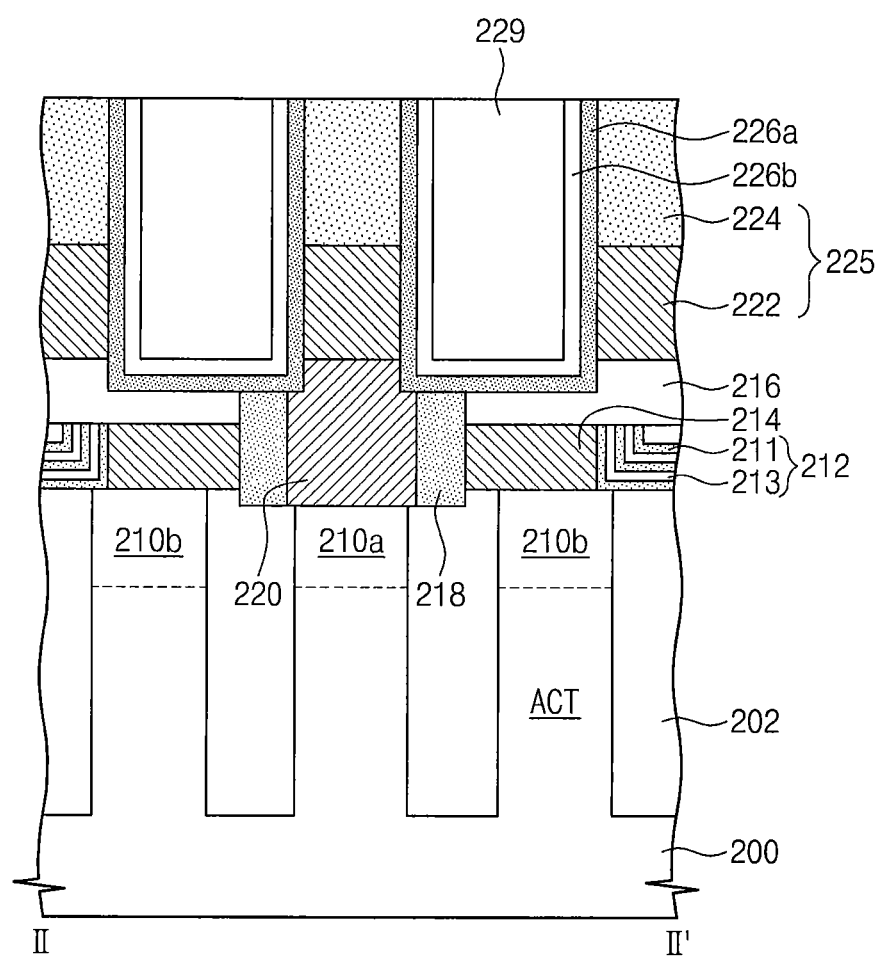
Figure 18C:
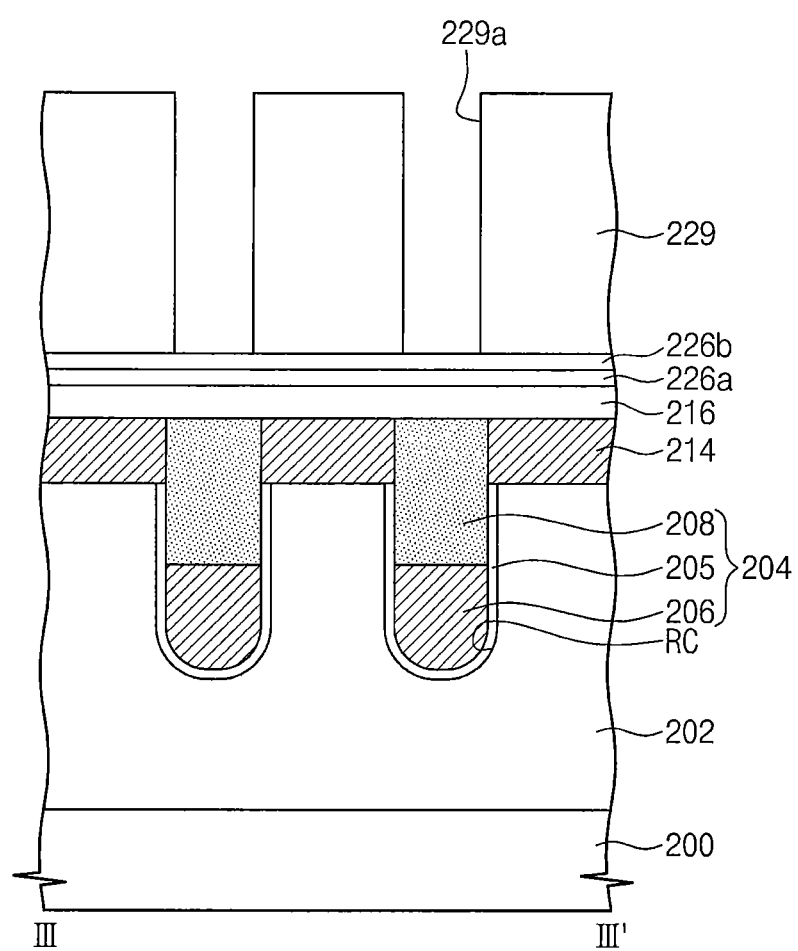

Referring to FIGS. 18A to 18C, a fourth silicon nitride layer 226a, a fourth metal nitride layer 226b, and second sacrificial patterns 229 may be formed on the substrate 200 provided with the bit line stacks 225.

In detail, the fourth silicon nitride layer 226a and the fourth metal nitride layer 226b may be formed on the substrate 200 provided with the bit line stacks 225. The fourth silicon nitride layer 226a and the fourth metal nitride layer 226b may be conformally formed using a PEALD method. The fourth silicon nitride layer 226a and the fourth metal nitride layer 226b may be formed to have a component ratio or thickness ratio of about 10:1. The fourth metal nitride layer 226b may be formed of or include at least one of aluminum nitride (AlN), hafnium nitride (HfN), or yttrium nitride (YiN).

Next, a sacrificial layer may be formed on the substrate 200 provided with the fourth silicon nitride layer 226a and the fourth metal nitride layer 226b. The sacrificial layer may be formed of or include at least one of oxide materials (e.g., silicon oxide). The sacrificial layer may be polished to expose the bit line stacks 225. The fourth silicon nitride layer 226a and the fourth metal nitride layer 226b may be removed from the bit line stacks 225.

The fourth silicon nitride layer 226a and the fourth metal nitride layer 226b may remain on both sidewalls of each of the bit line stacks 225. In addition, the fourth silicon nitride layer 226a may be in partial contact with the first contact plugs 220, the interlayered insulating layer 216, and the first spacer 218.

Thereafter, the sacrificial layer may be patterned to form the second sacrificial patterns 229, which are spaced apart from each other in the x-direction between the bit line stacks 225. The bit line stacks 225 and the second sacrificial patterns 229 may define regions 229a, which are overlapped with the first impurity region 210a in a plan view.

Figure 19A:
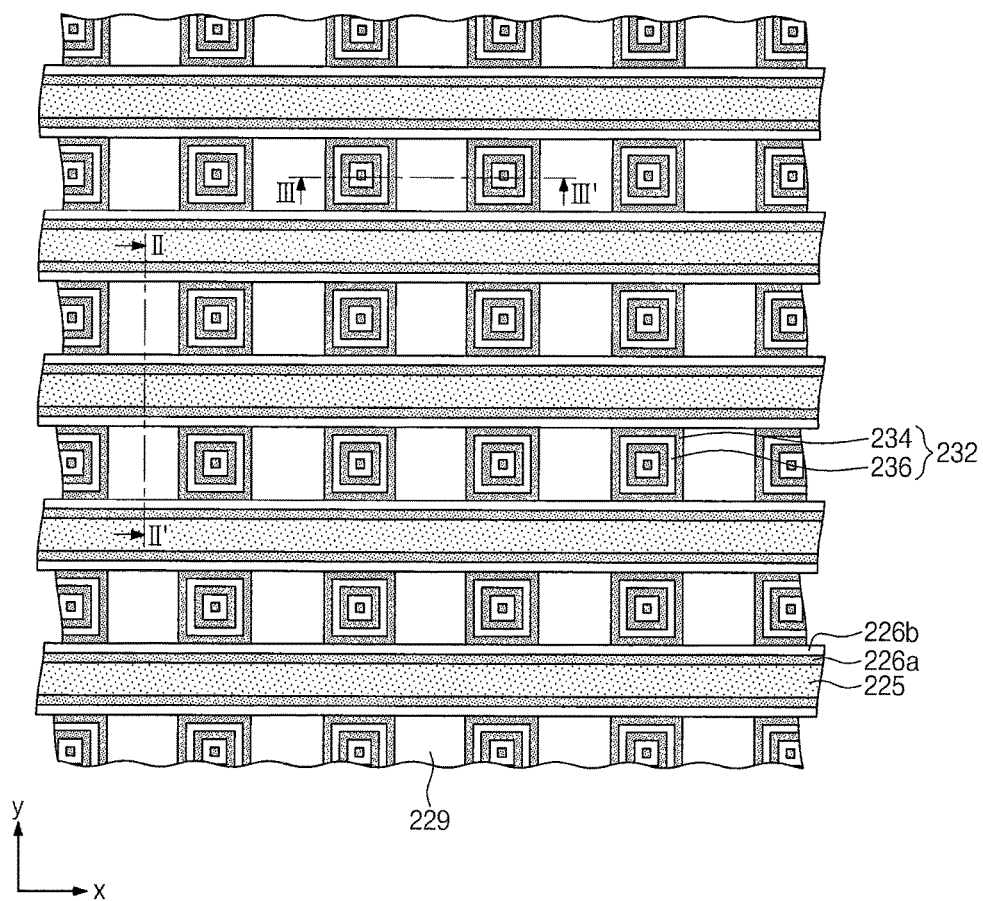
Figure 19B:
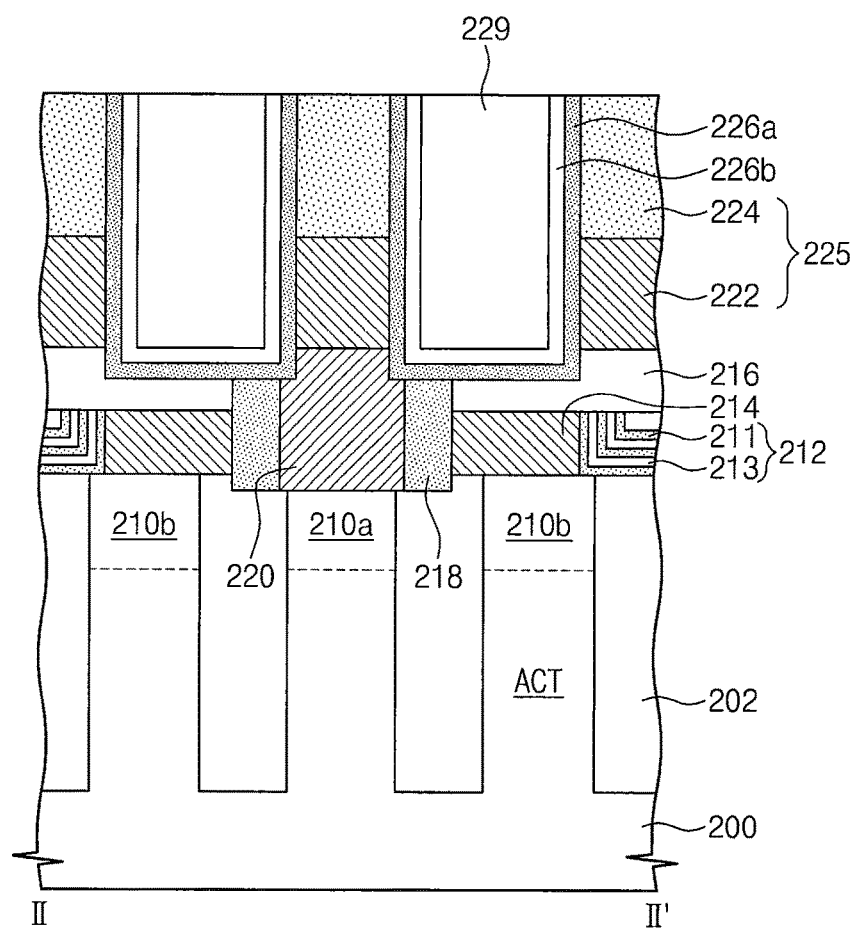
Figure 19C:
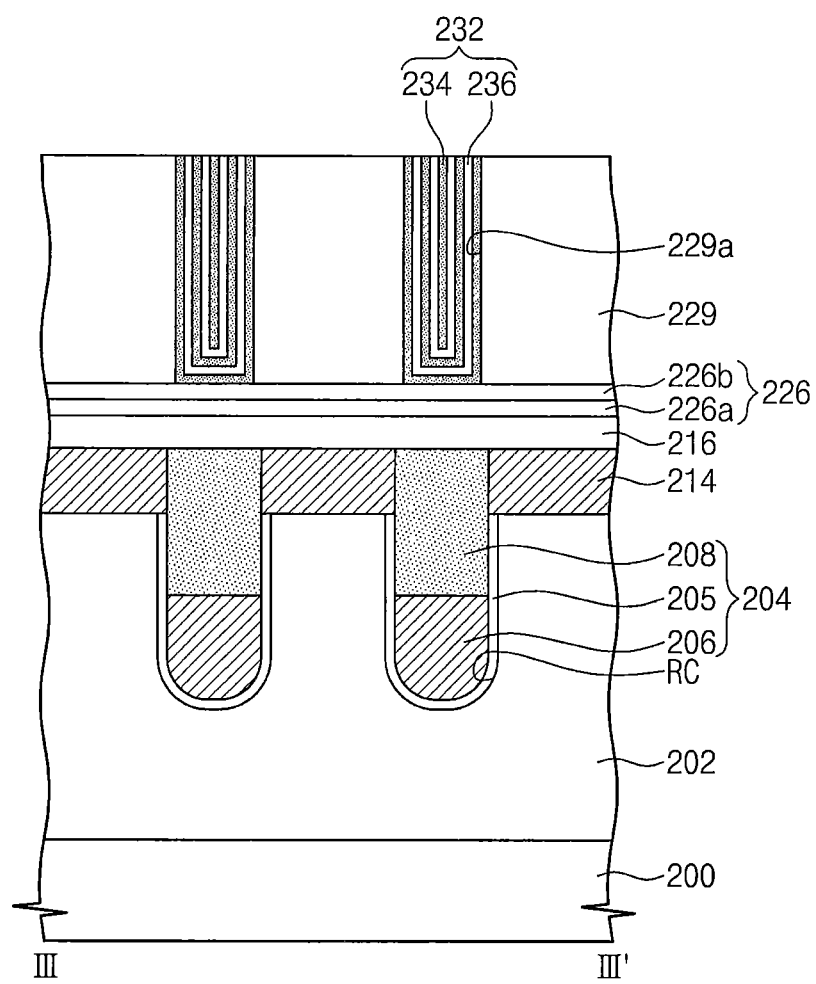

Referring to FIGS. 19A to 19C, upper insulating fences 232 may be formed in the regions 229a, respectively.

In detail, a fifth silicon nitride layer 234 and a fifth metal nitride layer 236 may be formed on the substrate 200 provided with the second sacrificial patterns 229 and the bit line stacks 225. The fifth silicon nitride layer 234 and the fifth metal nitride layer 236 may be alternatively formed by a PEALD process. The PEALD process may make it possible to minimize deformation of the second sacrificial patterns 229. The fifth silicon nitride layer 234 and the fifth metal nitride layer 236 may be formed to have a component ratio or thickness ratio of about 10:1. The fifth metal nitride layer 236 may be formed of or include at least one of aluminum nitride (AlN), hafnium nitride (HfN), or yttrium nitride (YiN).

Next, the fifth silicon nitride layer 234 and the fifth metal nitride layer 236 may be polished to expose the top surfaces of the second sacrificial patterns 229 and the top surfaces of the bit line stacks 225, and as a result, the upper insulating fences 232 may be formed. Also, bit line structures 228 may be formed. Between the bit line stacks 225, the upper insulating fences 232 may be formed to be spaced apart from each other in the x-direction. The upper insulating fences 232 and the second sacrificial patterns 229 may be alternately formed in the x-direction.

Figure 20A:
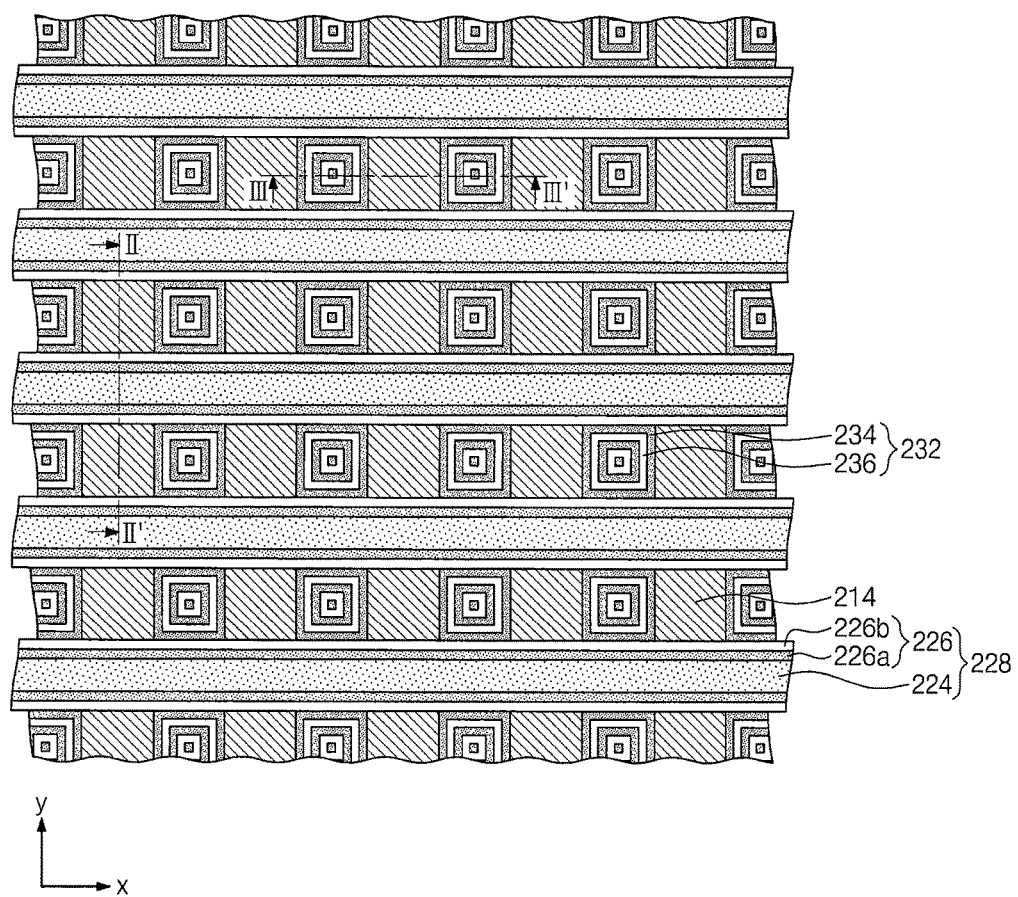
Figure 20B:
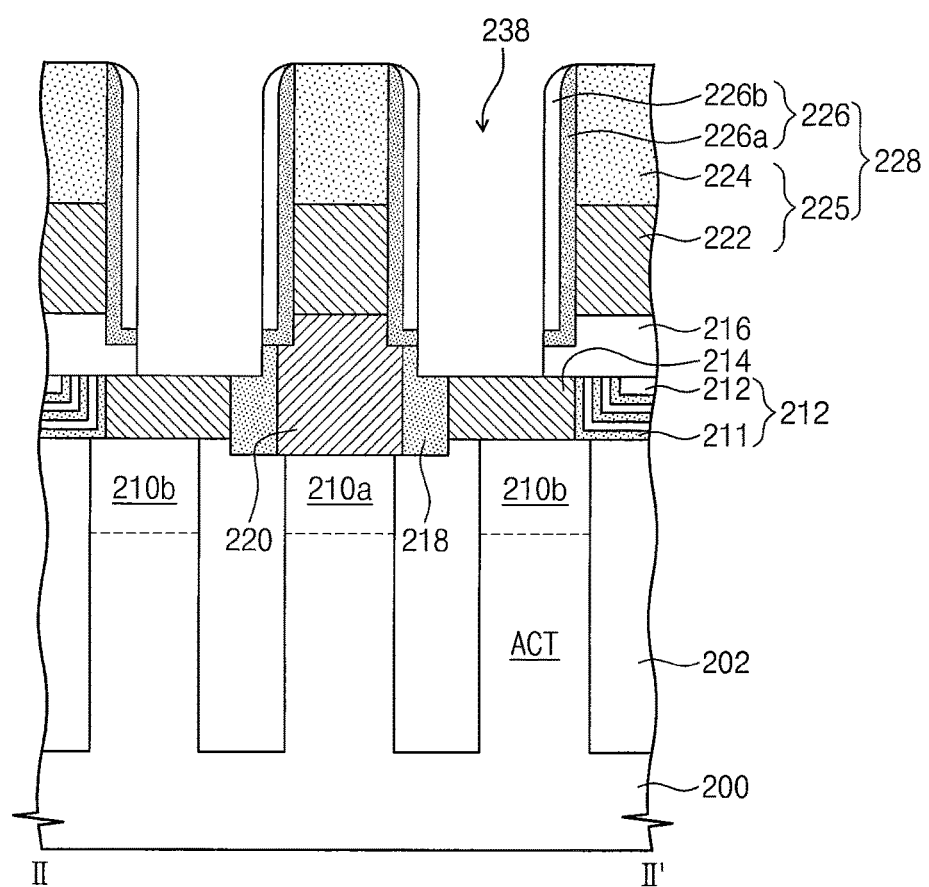
Figure 20C:
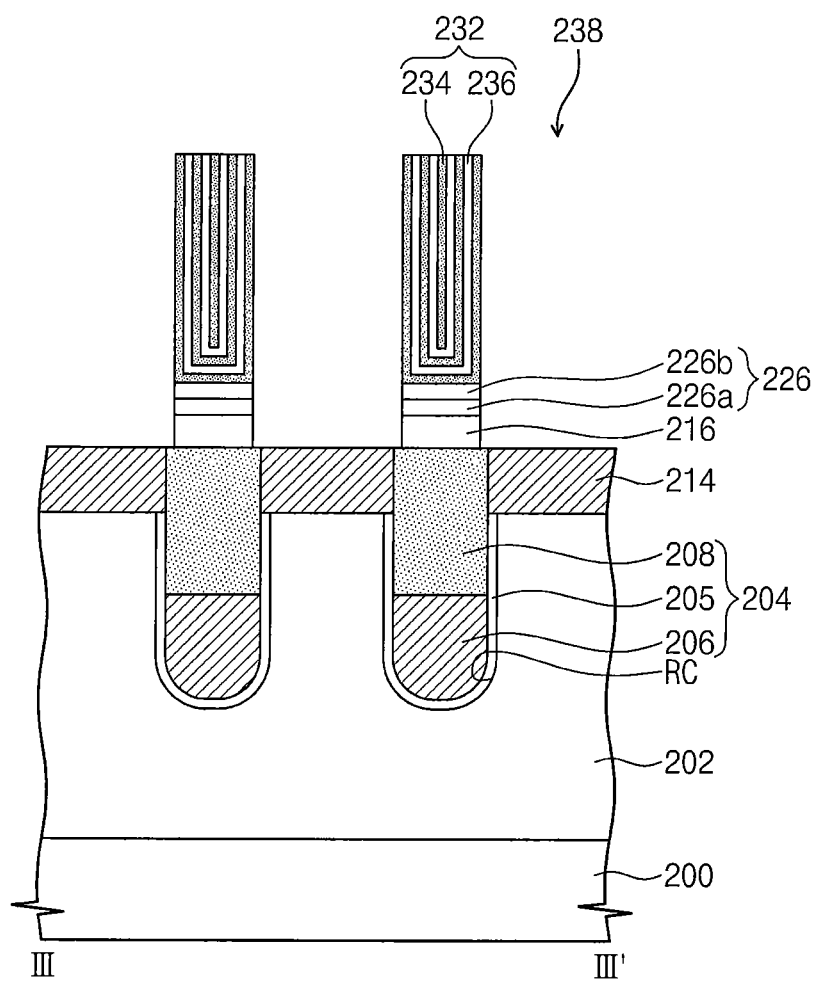

Referring to FIGS. 20A to 20C, the second sacrificial patterns 229 may be removed, and second spacers 226 may be formed on side surfaces of the bit line stacks 225.

In detail, the second sacrificial patterns 229 may be removed by a wet etching process. For example, an etchant for removing the second sacrificial patterns 229 may contain strong acid solution, in which deionized water and hydrofluoric acid are mixed in a ratio of 100:1.

The fourth silicon nitride layer 226a, the fourth metal nitride layer 226b, the fifth silicon nitride layer 234, and the fifth metal nitride layer 236 may have an etch-resistant property with respect to the etchant for removing the second sacrificial patterns 229. That is, the fourth silicon nitride layer 226a, the fourth metal nitride layer 226b, the fifth silicon nitride layer 234, and the fifth metal nitride layer 236 may not be damaged by the etchant for removing the second sacrificial patterns 229.

Thereafter, the fourth silicon nitride layer 226a and the fourth metal nitride layer 226b may be anisotropically etched to form the second spacers 226 on both sidewalls of each of the bit line stacks 225. As a result, the bit line structures 228 may be formed. Next, the first spacer 218 and the interlayered insulating layer 216 between the bit line structures 228 may be removed to form second contact holes 238. The bit line structures 228 may be used as an etch mask in a process of removing the first spacer 218 and the interlayered insulating layer 216.

Referring back to FIGS. 9A to 9C, a conductive material may be formed to fill the second contact holes 238, and as a result, second contact plugs 240 may be formed in the second contact holes 238, respectively. The conductive material may include at least one of doped polysilicon, metals, or metal compounds. For example, the conductive material may include at least one of tungsten (W), aluminum (Al), titanium (Ti), tantalum (Ta), titanium nitride (TiN), tantalum nitride (TaN), tungsten nitride (WN), or metal silicides. In exemplary embodiments, each of the second contact plugs 240 may be formed to have a top surface higher than those of the bit line structures 228. When viewed in a sectional view, each of the second contact plugs 240 may include a lower portion, which is provided in a corresponding one of the second contact holes 238, and an upper portion, which extends from the lower portion and is overlapped with a corresponding one of the bit line structures 228. Between each pair of the bit line structures 228, the second contact plugs 240 and the upper insulating fences 232 may be alternately arranged in the x-direction.

Thereafter, a data storage (not shown) may be formed to be electrically connected to each of the second contact plugs 240.

According to exemplary embodiments of the inventive concept, a semiconductor device may include insulating fences provided between conductive patterns. Each of the insulating fences may include a silicon nitride layer and a metal nitride layer. The silicon nitride layer and the metal nitride layer may make it possible to reduce a coupling effect and a leakage current between the conductive patterns. The silicon nitride layer and the metal nitride layer may have an etch-resistant property with respect to an etchant for removing sacrificial patterns. Accordingly, it is possible to suppress the insulating fence from being damaged in a process of removing the sacrificial patterns.

While example embodiments of the inventive concepts have been particularly shown and described, it will be understood by one of ordinary skill in the art that variations in form and detail may be made therein without departing from the spirit and scope of the attached claims.

What is claimed:

1. A semiconductor device, comprising:
   first and second line patterns on a substrate and extending in a first direction and parallel to each other;
   conductive patterns spaced apart on the substrate along the first direction between the first and second line patterns; and
   respective insulating fences on the substrate between respective pairs of the conductive patterns, wherein each of the respective insulating fences comprises:
   a plurality of silicon nitride layers on sidewalls of adjacent ones of the conductive patterns; and
   metal nitride layers interleaved with the silicon nitride layers.

2. The device of claim 1, wherein a thickness ratio of the silicon nitride layers to the metal nitride layers is about 10:1.

3. The device of claim 1, wherein the metal nitride layers comprise aluminum nitride, hafnium nitride or yttrium nitride.

4. The device of claim 1, wherein the metal nitride layers comprise a first metal nitride layer, wherein each of the line patterns comprises:
   a conductive line; and
   spacers provided on opposing sidewalls of the conductive line,
   wherein each spacer comprises:
   a silicon nitride layer; and
   a second metal nitride layer between the silicon nitride layer and adjacent ones of the conductive patterns.

5. The device of claim 1, wherein the conductive patterns comprise tungsten, and the insulating fences comprise silicon nitride with metallic impurities having a work-function that is less than that a work-function of silicon or tungsten.

6. The device of claim 5, wherein the metallic impurities comprise aluminum.

7. The device of claim 5, wherein the metallic impurities comprise hafnium or yttrium.

8. The device of claim 5, wherein the metallic impurities are reacted with nitrogen in the silicon nitride to form a metal nitride.

9. A semiconductor device, comprising:
a substrate with an active region;
a device isolation layer provided on the substrate to define the active region;
gate stacks crossing the active region and the device isolation layer in a first direction;
first and second impurity regions formed in the active region and adjacent opposing sides of each of the gate stacks;
bit line structures electrically connected to the second impurity regions, the bit line structures extending in a second direction crossing the first direction;
respective contact plugs on the first impurity region between the bit line structures; and
respective insulating fences on the gate stacks between the bit line structures, the respective insulating fences and the contact plugs being alternately disposed in the second direction,
wherein each of the respective insulating fences comprises:
a plurality of silicon nitride layers on sidewalls of adjacent ones of the contact plugs; and
metal nitride layers interleaved with the silicon nitride layers.

10. The device of claim 9, wherein a thickness ratio of the plurality of silicon nitride layers to the metal nitride layers is about 10:1.

11. The device of claim 9, wherein the respective insulating fences comprise respective first insulating fences, the device further comprising:
respective conductive pads spaced apart from each other in the first direction between the gate stacks to connect the respective contact plugs to the second impurity regions; and
respective second insulating fences on the device isolation layer between the gate stacks, the respective second insulating fences and the respective conductive pads being alternately disposed in the first direction,
wherein each of the respective second insulating fences comprise at least one first silicon nitride layer and at least one first metal nitride layer, alternately stacked on the device isolation layer.

12. The device of claim 11, wherein each of the bit line structures comprises:
bit line stacks provided on the second impurity regions, the bit line stacks extending in the second direction; and
spacers provided on opposing sidewalls of each of the bit line stacks,
wherein each of the spacers comprises:
a second silicon nitride layer disposed on the opposing sidewalls of each of the bit line stacks; and
a second metal nitride layer disposed on the second silicon nitride layer.

13. A method of fabricating a semiconductor device, comprising:
forming line patterns on a substrate, to extend in a first direction parallel to each other;
forming sacrificial patterns between the line patterns, the sacrificial patterns being spaced apart from each other in the first direction;
forming respective insulating fences comprising a composition of silicon nitride and a metal in respective gaps between the sacrificial patterns;
removing the sacrificial patterns; and
forming conductive patterns between the insulating fences,
wherein forming the respective insulating fences comprises:
forming a plurality of silicon nitride layers on sidewalls of adjacent ones of the sacrificial patterns; and
forming metal nitride layers interleaved with the silicon nitride layers.

14. The method of claim 13, wherein forming the insulating fences comprises forming the silicon nitride layers and the metal nitride layers using a plasma enhanced atomic layer deposition process.

15. The method of claim 13, wherein a thickness ratio of the silicon nitride layer layers to the metal nitride layers is about 10:1.

* * * * *